(12) United States Patent
Achtenberg et al.

(10) Patent No.: US 10,446,242 B2
(45) Date of Patent: Oct. 15, 2019

(54) TEMPERATURE VARIATION COMPENSATION

(71) Applicant: WESTERN DIGITAL TECHNOLOGIES, INC., San Jose, CA (US)

(72) Inventors: Stella Achtenberg, Netanya (IL); Eran Sharon, Rishon Lezion (IL); David Rozman, Kiryat-Malakhi (IL); Alon Eyal, Zichron Yaakov (IL); Idan Alrod, Herzeliya (IL); Dana Lee, Saratoga, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 0 days.

(21) Appl. No.: 15/619,157

(22) Filed: Jun. 9, 2017

(65) Prior Publication Data
US 2017/0345510 A1    Nov. 30, 2017

Related U.S. Application Data

(63) Continuation-in-part of application No. 15/167,316, filed on May 27, 2016, now Pat. No. 9,996,281.

(51) Int. Cl.
*G11C 7/00*    (2006.01)
*G11C 16/34*    (2006.01)
(Continued)

(52) U.S. Cl.
CPC ...... *G11C 16/3413* (2013.01); *G06F 11/1048* (2013.01); *G11C 7/04* (2013.01); *G11C 11/5628* (2013.01); *G11C 11/5642* (2013.01); *G11C 16/10* (2013.01); *G11C 16/26* (2013.01); *G11C 16/3418* (2013.01); *G11C 16/3431* (2013.01); *G11C 16/3459* (2013.01);
(Continued)

(58) Field of Classification Search
CPC . G11C 16/3413; G11C 16/26; G11C 16/3459; G11C 29/52; G06F 11/1072; H03M 13/2906
See application file for complete search history.

(56) References Cited

U.S. PATENT DOCUMENTS 7,782,674 B2    8/2010    Roohparvar et al.
7,881,120 B2    2/2011    Yoshihara et al.
(Continued)

OTHER PUBLICATIONS

Search report and written opinion for PCT/US2017/019612 dated Jul. 14, 2017.
(Continued)

*Primary Examiner* — Uyen B Tran
(74) *Attorney, Agent, or Firm* — Patterson & Sheridan, LLP; Steven H. Versteeg

(57) ABSTRACT

A device includes a memory and a controller coupled to the memory. The controller is configured to determine a temperature-based value of a search parameter in response to detecting that an error rate of a codeword read from the memory exceeds a threshold error rate. The controller is further configured to iteratively modify one or more memory access parameters associated with reducing temperature-dependent threshold voltage variation and to re-read the codeword using the modified one or more memory access parameters.

20 Claims, 16 Drawing Sheets

(51) Int. Cl.
  *G11C 29/52* (2006.01)
  *H03M 13/29* (2006.01)
  *G11C 16/26* (2006.01)
  *G06F 11/10* (2006.01)
  *G11C 7/04* (2006.01)
  *G11C 11/56* (2006.01)
  *G11C 16/10* (2006.01)
  *G11C 29/02* (2006.01)

(52) U.S. Cl.
  CPC ............ *G11C 29/028* (2013.01); *G11C 29/52* (2013.01); *H03M 13/2906* (2013.01)

(56) References Cited

U.S. PATENT DOCUMENTS

| | | | |
|---|---|---|---|
| 8,296,625 | B2 | 10/2012 | Diggs et al. |
| 8,472,274 | B2 | 6/2013 | Fai et al. |
| 8,687,421 | B2 | 4/2014 | Avila et al. |
| 9,202,579 | B2 | 12/2015 | Hsiung et al. |
| 2006/0104140 | A1 | 5/2006 | Tahara |
| 2011/0145521 | A1 | 6/2011 | Aoki et al. |
| 2011/0302353 | A1 | 12/2011 | Confalonieri et al. |
| 2012/0134213 | A1 | 5/2012 | Choi et al. |
| 2012/0144270 | A1* | 6/2012 | Diggs ................ G06F 11/1068 714/769 |
| 2012/0224425 | A1* | 9/2012 | Fai ...................... G11C 11/5642 365/185.09 |
| 2014/0035560 | A1* | 2/2014 | Olmos ............. G01R 31/31719 324/76.41 |
| 2014/0226412 | A1 | 8/2014 | Yeh et al. |
| 2015/0310938 | A1 | 10/2015 | Kim et al. |
| 2016/0117216 | A1* | 4/2016 | Muchherla ............. G06F 11/08 714/6.11 |
| 2017/0117033 | A1 | 4/2017 | Doo et al. |

OTHER PUBLICATIONS

International Preliminary Report on Patentability and Written Opinion issued in corresponding International Patent Application No. PCT/US2017/019612, dated Sep. 4, 2018 (11 pages).

* cited by examiner

300

302 Offset Table

Default Value of a Read Voltage 301

|  |  | Read Temperature Range | | | | |
|---|---|---|---|---|---|---|
|  |  | 0 | 1 | 2 | 3 | 4 |
| Write Temperature Range | 0 | N/A | Offset_Neg_1 | Offset_Neg_2 | Offset_Neg_3 | Offset_Neg_4 |
|  | 1 | Offset_Pos_1 | N/A | Offset_Neg_1 | Offset_Neg_2 | Offset_Neg_3 |
|  | 2 | Offset_Pos_2 | Offset_Pos_1 | N/A | Offset_Neg_1 | Offset_Neg_2 |
|  | 3 | Offset_Pos_3 | Offset_Pos_2 | Offset_Pos_1 | N/A | Offset_Neg_1 |
|  | 4 | Offset_Pos_4 | Offset_Pos_3 | Offset_Pos_2 | Offset_Pos_1 | N/A |

304 Range Table

| Range | Temperature |
|---|---|
| 0 | -25 to 0 |
| 1 | 1 to 25 |
| 2 | 26 to 50 |
| 3 | 51 to 75 |
| 4 | 76 to 100 |

TEMPERATURE VARIATION COMPENSATION

CROSS-REFERENCE TO RELATED APPLICATIONS

The present application claims benefit of and is a continuation-in-part of U.S. application Ser. No. 15/167,316, filed May 27, 2016, which is incorporated by reference herein in its entirety and which claims benefit of U.S. Provisional Application No. 62/303,891, filed Mar. 4, 2016, which is incorporated by reference herein in its entirety.

FIELD OF THE DISCLOSURE

This disclosure is generally related to data storage devices and more particularly to temperature variation compensation techniques.

BACKGROUND

Non-volatile data storage devices, such as flash solid state drive (SSD) memory devices or removable storage cards, have allowed for increased portability of data and software applications. Flash memory devices can enhance data storage density by storing multiple bits in each flash memory cell. For example, Multi-Level Cell (MLC) flash memory devices provide increased storage density by storing 2 bits per cell, 3 bits per cell, 4 bits per cell, or more. Although increasing the number of bits per cell and reducing device feature dimensions may increase a storage density of a memory device, a bit error rate (BER) of data stored at the memory device may also increase.

In addition, increased BER due to temperature changes between programming temperature (e.g., a temperature of a memory when data is written to the memory) and later reading temperature (e.g., a temperature of the memory when the data is read from the memory) is becoming an increasingly significant issue in recent memory generations. Because each storage element of a non-volatile data storage device may have a distinct cross temperature coefficient, each storage element may exhibit a different threshold voltage (Vt) shift due to a temperature change relative to the temperature at which the storage element was programmed and verified. The Vt shift per storage element is a function of the temperature difference. As a result, reading a page at a different temperature than the programming temperature of the page results in shifting and widening of the cell voltage distributions (CVDs) of the different states of the storage devices and in an increased BER. Shifting and widening of the CVDs and increased BER arises in both temperature change directions, such as when data is read from storage elements at a higher temperature than the data was written to the storage elements, and also when the data is read from storage elements at a lower temperature than the data was written to the storage elements.

BRIEF DESCRIPTION OF THE DRAWINGS

FIG. 3 is a diagram illustrating a particular example of tables that may be used by the data storage device of FIG. 1;

DETAILED DESCRIPTION

Figure 1:
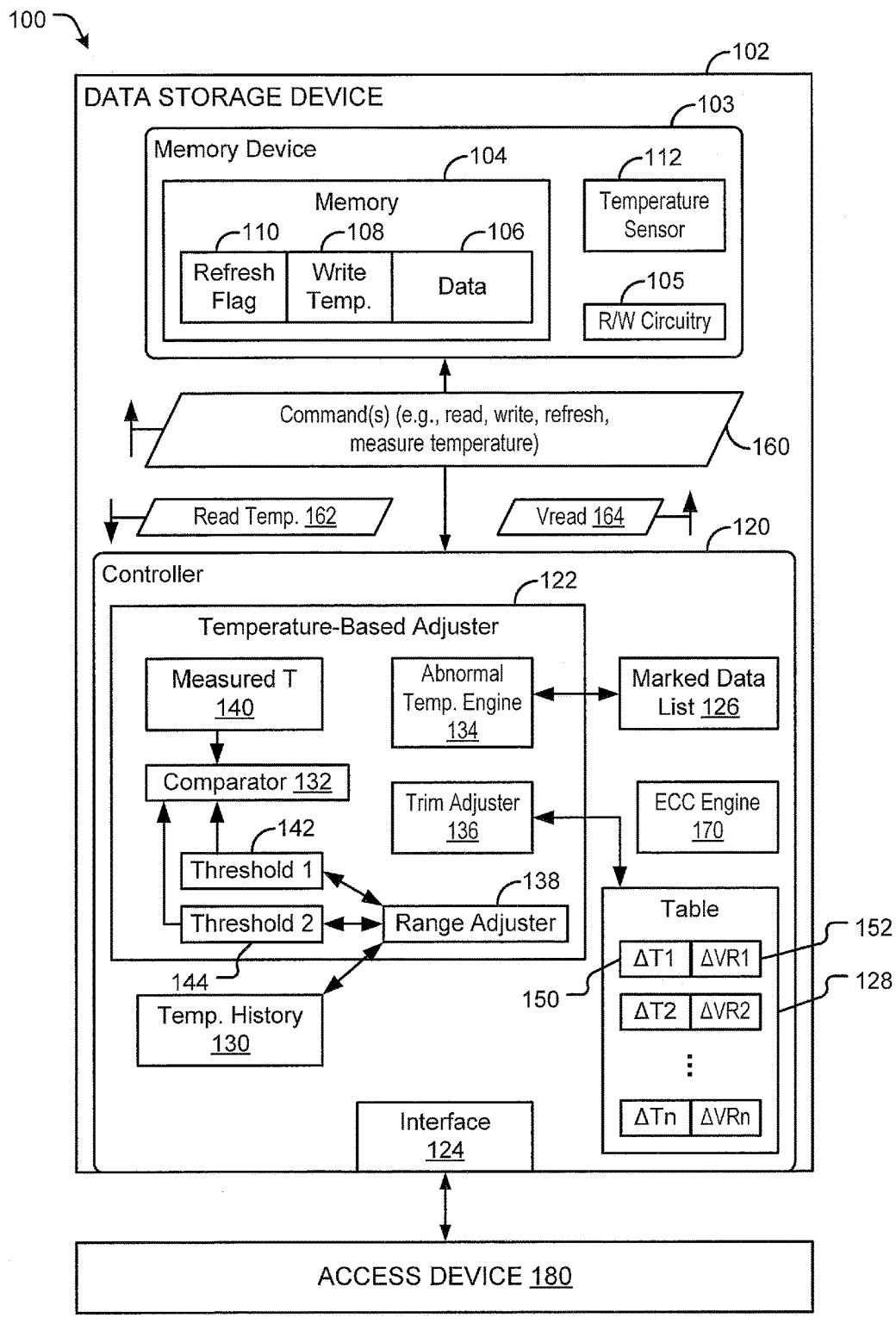
FIG. 1 is a block diagram of an illustrative example of a system including a data storage device configured to adjust memory access parameters based on temperature.

A data storage device is configured to perform an iterative memory access parameter search to determine values of one or more memory access parameters that reduce temperature-based effects at the data storage device. For example, the one or more memory access parameters may include one or more of a bit line voltage or a duration of a time interval used for charging a capacitor of a sense amplifier during a read operation (also referred to herein as a sense amplifier integration time).

The data storage device is further configured to initialize the iterative memory access parameter search based on a temperature measurement. For example, an initial value of a memory access parameter may be selected based on the temperature measurement. Alternatively or in addition, a range of values (also referred to herein as a search range) of a memory access parameter may be selected based on the temperature measurement. The iterative memory access parameter search may be performed by adjusting the one or more memory access parameters to determine one or more memory access parameter values that compensate for temperature-based effects at the data storage device (e.g., by compensating for shifts in threshold voltages of storage elements).

In a particular example, the iterative memory access parameter search may be performed in connection with a valley search at a memory of the data storage device. For example, performing the valley search may include generating, for each bit line voltage of a plurality of bit line voltages, data indicating a histogram of distributions of states of storage elements of the memory. The valley search may further include selecting a particular bit line voltage resulting in a "best" set of distributions (e.g., a set having the "tightest" distributions of states, such as the lowest "valley" between distributions). In this example, adjustment of a bit line voltage preformed in connection with an iterative memory access parameter search may be combined with a valley search. The valley search may include applying multiple bias voltages to storage elements of the memory and determining, for each of the multiple bias voltages, a number of storage elements associated with that bias voltage (e.g., in a CVD histogram bin) to detect a lowest detected population of storage elements, corresponding to a "valley" between adjacent state distributions of the storage elements. To illustrate, in an illustrative tri-level cell (TLC) implementation (where a storage element has one of eight states), seven "valleys" may exist between the eight states, and the memory may determine, for each bias voltage, a number of storage elements within the bin associated with the bias voltage. The valley search may include selecting, for each valley between states, a particular bias voltage of the multiple bias voltages that corresponds to the lowest number of the numbers of storage elements (e.g., by selecting a bin with a "minimal" population as the valley bin). In some implementations, accuracy of a valley search may be increased by subdividing a bin and performing several sense operations for the bin to increase accuracy by increasing resolution (e.g., up to the resolution of an digital-to-analog (DAC) convertor) used in connection with a valley search. A valley may be correlated with a minimal bit error rate (BER) voltage threshold and may be used to determine one or more of a bit line voltage or a sense amplifier integration time, which may reduce BER in conditions of cross temperature (e.g., where a read temperature is different than a programming temperature).

One or more aspects of the disclosure may reduce time or complexity of a search to compensate for temperature-based effects at a memory. For example, by selecting an initial value or a search range of a memory access parameter based on a temperature measurement, an iterative memory access parameter search may be initialized based on current operating conditions of the data storage device. As a result, initializing an iterative memory access parameter search based on the temperature measurement may reduce time spent performing the iterative memory access parameter search or may improve accuracy of the iterative memory access parameter search.

Particular examples in accordance with the disclosure are described below with reference to the drawings. In the description, common features are designated by common reference numbers. As used herein, "exemplary" may indicate an example, an implementation, and/or an aspect, and should not be construed as limiting or as indicating a preference or a preferred implementation. Further, it is to be appreciated that certain ordinal terms (e.g., "first" or "second") may be provided for identificatoin and ease of reference and do not necessarily imply physical characteristics or ordering. Therefore, as used herein, an ordinal term (e.g., "first," "second," "third," etc.) used to modify an element, such as a structure, a component, an operation, etc., does not necessarily indicate priority or order of the element with respect to another element, but rather distinguishes the element from another element having a same name (but for use of the ordinal term). In addition, as used herein, indefinite articles ("a" and "an") may indicate "one or more" rather than "one." As used herein, a structure or operation that "comprises" or "includes" an element may include one or more other elements not explicitly recited. Further, an operation performed "based on" a condition or event may also be performed based on one or more other conditions or events not explicitly recited.

FIG. 1 depicts an illustrative example of a system 100 that includes a data storage device 102 and an access device 180 (e.g., a host device or another device). The data storage device 102 includes a temperature-based adjuster 122 that is configured to perform compensation based on temperature differences between writing data to a memory 104 and reading the data from the memory 104. The temperature-based adjuster 122 is also configured to perform compensation based on a programming temperature (e.g., a temperature of the memory 104 that is measured just before, during, or after data is written into the memory 104) being outside of a "normal" temperature range.

The data storage device 102 and the access device 180 may be coupled via a connection (e.g., a communication path), such as a bus or a wireless connection. The data storage device 102 may include a first interface 124 (e.g., an access device or host interface) that enables communication via the communication path between the data storage device 102 and the access device 180.

The data storage device 102 may include or correspond to a solid state drive (SSD) which may be included in, or distinct from (and accessible to), the access device 180. For example, the data storage device 102 may include or correspond to an SSD, which may be used as an embedded storage drive (e.g., a mobile embedded storage drive), an enterprise storage drive (ESD), a client storage device, or a cloud storage drive, as illustrative, non-limiting examples. In some implementations, the data storage device 102 is coupled to the access device 180 indirectly, e.g., via a network. For example, the network may include a data center storage system network, an enterprise storage system network, a storage area network, a cloud storage network, a local area network (LAN), a wide area network (WAN), the Internet, and/or another network. In some implementations, the data storage device 102 may be a network-attached storage (NAS) device or a component (e.g., a solid-state drive (SSD) device) of a data center storage system, an enterprise storage system, or a storage area network.

In some implementations, the data storage device 102 may be embedded within the access device 180, such as in accordance with a Joint Electron Devices Engineering Council (JEDEC) Solid State Technology Association Universal Flash Storage (UFS) configuration. For example, the data storage device 102 may be configured to be coupled to the access device 180 as embedded memory, such as eMMC® (trademark of JEDEC Solid State Technology Association, Arlington, Va.) and eSD, as illustrative examples. To illustrate, the data storage device 102 may correspond to an eMMC (embedded MultiMedia Card) device. As another example, the data storage device 102 may correspond to a memory card, such as a Secure Digital (SD®) card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). Alternatively, the data storage device 102 may be removable from the access device 180 (i.e., "removably" coupled to the access device 180). As an example, the data storage device 102 may be removably coupled to the access device 180 in accordance with a removable universal serial bus (USB) configuration.

The data storage device 102 may operate in compliance with an industry specification. For example, the data storage device 102 may include a SSD and may be configured to communicate with the access device 180 using a small computer system interface (SCSI)-type protocol, such as a serial attached SCSI (SAS) protocol. As other examples, the data storage device 102 may be configured to communicate with the access device 180 using a NVM Express (NVMe) protocol or a serial advanced technology attachment (SATA) protocol. In other examples, the data storage device 102 may operate in compliance with a JEDEC eMMC specification, a JEDEC Universal Flash Storage (UFS) specification, one or more other specifications, or a combination thereof, and may be configured to communicate using one or more protocols, such as an eMMC protocol, a universal flash storage (UFS) protocol, a universal serial bus (USB) protocol, and/or another protocol, as illustrative, non-limiting examples.

The access device 180 may include a memory interface (not shown) and may be configured to communicate with the data storage device 102 via the memory interface to read data from and write data to the memory device 103 of the data storage device 102. For example, the access device 180 may be configured to communicate with the data storage device 102 using a SAS, SATA, or NVMe protocol. As other examples, the access device 180 may operate in compliance with a Joint Electron Devices Engineering Council (JEDEC) industry specification, such as a Universal Flash Storage (UFS) Access Controller Interface specification. The access device 180 may communicate with the memory device 103 in accordance with any other suitable communication protocol.

The access device 180 may include a processor and a memory. The memory may be configured to store data and/or instructions that may be executable by the processor. The memory may be a single memory or may include multiple memories, such as one or more non-volatile memories, one or more volatile memories, or a combination thereof. The access device 180 may issue one or more commands to the data storage device 102, such as one or more requests to erase data, read data from, or write data to the memory device 103 of the data storage device 102. For example, the access device 180 may be configured to provide data to be stored at the memory device 103 or to request data to be read from the memory device 103. The access device 180 may include a mobile telephone, a computer (e.g., a laptop, a tablet, or a notebook computer), a music player, a video player, a gaming device or console, an electronic book reader, a personal digital assistant (PDA), a portable navigation device, a computer, such as a laptop computer or notebook computer, a network computer, a server, any other electronic device, or any combination thereof, as illustrative, non-limiting examples.

The memory device 103 of the data storage device 102 may include one or more memory dies (e.g., one memory die, two memory dies, eight memory dies, or another number of memory dies). The memory device 103 includes a memory 104, such as a non-volatile memory of storage elements included in a memory die of the memory device 103. For example, the memory 104 may include a flash memory, such as a NAND flash memory, or a resistive memory, such as a resistive random access memory (ReRAM), as illustrative, non-limiting examples. In some implementations, the memory 104 may include or correspond to a memory die of the memory device 103. The memory 104 may have a three-dimensional (3D) memory configuration. As an example, the memory 104 may have a 3D vertical bit line (VBL) configuration. In a particular implementation, the memory 104 is a non-volatile memory having a 3D memory configuration that is monolithically formed in one or more physical levels of arrays of memory cells having an active area disposed above a silicon substrate. Alternatively, the memory 104 may have another configuration, such as a two-dimensional (2D) memory configuration or a non-monolithic 3D memory configuration (e.g., a stacked die 3D memory configuration).

Although the data storage device 102 is illustrated as including the memory device 103, in other implementations the data storage device 102 may include multiple memory devices that may be configured in a similar manner as described with respect to the memory device 103. For example, the data storage device 102 may include multiple memory devices, each memory device including one or more packages of memory dies, each package of memory dies including one or more memories such as the memory 104. Data striping and error recovery as described with respect to pages of the memory 104 may be extended to include data striping and error recovery across multiple dies, across multiple packages, across multiple memory devices, or any combination thereof.

The memory 104 may include one or more blocks, such as a NAND flash erase group of storage elements. Each storage element of the memory 104 may be programmable to a state (e.g., a threshold voltage in a flash configuration or a resistive state in a resistive memory configuration) that indicates one or more values. Each block of the memory 104 may include one or more word lines. Each word line may include one or more pages, such as one or more physical pages. In some implementations, each page may be configured to store a codeword. A word line may be configurable to operate as a single-level-cell (SLC) word line, as a multi-level-cell (MLC) word line, or as a tri-level-cell (TLC) word line, as illustrative, non-limiting examples.

The memory device 103 may include support circuitry, such as read/write circuitry 105, to support operation of one or more memory dies of the memory device 103. Although depicted as a single component, the read/write circuitry 105 may be divided into separate components of the memory device 103, such as read circuitry and write circuitry. The read/write circuitry 105 may be external to the one or more dies of the memory device 103. Alternatively, one or more individual memory dies of the memory device 103 may include corresponding read/write circuitry that is operable to read data from and/or write data to storage elements within the individual memory die independent of any other read and/or write operations at any of the other memory dies.

The controller 120 is coupled to the memory device 103 via a bus, an interface (e.g., interface circuitry), another structure, or a combination thereof. For example, the bus may include one or more channels to enable the controller 120 to communicate with a single memory die of the memory device. As another example, the bus may include multiple distinct channels to enable the controller 120 to communicate with each memory die of the memory device 103 in parallel with, and independently of, communication with other memory dies of the memory device 103.

The controller 120 is configured to receive data and instructions from the access device 180 and to send data to the access device 180. For example, the controller 120 may send data to the access device 180 via the first interface 124, and the controller 120 may receive data from the access device 180 via the first interface 124. The controller 120 is configured to send data and commands to the memory 104 and to receive data from the memory 104. For example, the controller 120 is configured to send data and a write command to cause the memory 104 to store data to a specified address of the memory 104. The write command may specify a physical address of a portion of the memory 104 (e.g., a physical address of a word line of the memory 104) that is to store the data. The controller 120 may also be configured to send data and commands to the memory 104 associated with background scanning operations, garbage collection operations, and/or wear leveling operations, etc., as illustrative, non-limiting examples. The controller 120 is configured to send a read command to the memory 104 to access data from a specified address of the memory 104. The read command may specify the physical address of a portion of the memory 104 (e.g., a physical address of a word line of the memory 104).

The memory device 103 may also include a temperature sensor 112. For example, the temperature sensor 112 may be configured to measure a temperature and may be configured to provide an indication of the measured temperature to the controller 120, such as a read temperature 162. For example, the temperature sensor 112 may be responsive to one or more commands 160, such as a command to measure temperature. The memory device 103 may include a single temperature sensor 112, or may include multiple temperatures sensors. For example, in an implementation with a memory device 103 that includes multiple memory dies, each of the multiple memory dies may include a separate temperature sensor 112 such as described with reference to FIG. 8. Each of the temperature sensors 112 may be independently polled by the controller 120 to provide a respective temperature 162 for the associated memory die.

The memory 104 is illustrated as including representative data 106. For example, the data 106 may include encoded data, such as an ECC codeword, that is written to one or more word lines in one or more blocks of the memory 104. The memory 104 may also store a write temperature 108 associated with the data 106. For example, the write temperature 108 may indicate a temperature measurement corresponding to the memory device 103 at a time the data 106 was written to the memory 104. For example, the write temperature 108 may be determined currently with, prior to, or following programming of the data 106 to the memory 104. The write temperature 108 may be stored in a block or word line as metadata in the block header or the word line header.

The memory 104 also includes a refresh flag 110 associated with the data 106. As discussed in further detail below, the refresh flag 110 may indicate the data 106 was stored when a temperature at the memory 104 was in an abnormal temperature range. The refresh flag 110 may be accessed by the controller 120 to identify the data 106 as a target for refresh when the temperature of the memory 104 falls below a particular threshold temperature.

The controller 120 includes a temperature-based adjuster 122, a marked data list 126, an ECC engine 170, a temperature history 130, and data structure (e.g., a table 128) that associates temperature differences to read voltage parameters. The ECC engine 170 is configured to receive data to be stored to the memory 104 and to generate a codeword. For example, the ECC engine 170 may include an encoder configured to encode data using an ECC scheme, such as a Reed Solomon encoder, a Bose-Chaudhuri-Hocquenghem (BCH) encoder, a low-density parity check (LDPC) encoder, a Turbo Code encoder, an encoder configured to encode one or more other ECC encoding schemes, or any combination thereof. The ECC engine 170 may include one or more decoders configured to decode data read from the memory 104 to detect and correct, up to an error correction capability of the ECC scheme, any bit errors that may be present in the data.

The temperature-based adjuster 122 is configured to perform one or more operations to adjust for differences between write temperatures and read temperatures of data written into and/or read from the memory 104. For example, the temperature-based adjuster 122 includes a comparator 132 configured to compare a measured temperature 140 to one or more thresholds, illustrated as a first threshold 142 and a second threshold 144. For example, when the measured temperature 140 corresponds to a temperature at the time of writing data to the memory 104, such as a temperature retrieved from the temperature sensor 112 in response to receiving the data 106 at the controller 120 to be written to the memory device 103, in response to the comparator 132 determining that the measured temperature 140 exceeds the first threshold 142, the abnormal temperature engine 134 may be activated.

The abnormal temperature engine 134 may be configured to perform one or more operations associated with writing data to the memory 104 when a temperature of the memory 104 is in an abnormal range. For example, the abnormal temperature engine 134 may be responsive to the comparator 132 to add the refresh flag 110 to be stored at the memory 104 in conjunction with the data 106, to store an indication of the data 106 to the marked data list 126, to initiate one or more other actions, or any combination thereof. For example, the one or more other actions that may be initiated by the abnormal temperature engine 134 may correspond to designating that the data to be stored needs to be encoded using a higher number of parity bits at the ECC engine 170 than data that is stored when the temperature is not in the abnormal temperature range. Alternatively, or in addition, the abnormal temperature engine 134 may cause data to be stored in the memory 104 in a single level cell (SLC) mode instead of a multilevel cell (MLC) mode, with multiple copies of the data rather than a single copy, and/or with a slower and more reliable trim, e.g. an increased number of program pulses, a reduced programming voltage step size, or one or more other adjustments to cause programming to be more reliable than during normal operation.

The trim adjuster 136 may be configured to adjust one or more parameters used during writing data to or reading data from the memory 104. For example, the trim adjuster 136 may be configured to retrieve one or more offset values from the table 128 based on the difference between a temperature that the data is written to the memory 104 and a temperature at which the data is to be read from the memory 104. For example, when the controller 120 receives the request from the access device 180 to read the data 106, the controller 120 may retrieve the write temperature 108 from the memory 104 and may further instruct the temperature sensor 112 to perform a measurement operation and to provide the read temperature 162 to the controller 120. The trim adjuster 136 may be configured to use a difference between the read temperature 162 and the write temperature 108 to determine an index into the table 128. For example, a temperature difference (illustrated as ΔT1) may correspond to a first change in read voltages 152 (ΔVR1). Different amounts of temperature difference may correspond to different amounts of read voltage offset values that may be retrieved from the table 128. The trim adjuster 136 may be configured to adjust a default value of one or more trim parameters based on offset values retrieved from table 128 and to provide the adjusted values to the memory device 103 for use during data retrieval from memory 104.

The description above refers to a change in read parameters. For programming parameters (i.e. for changing the programming trim), the trim adjuster may change for example the programming pulse step size or width, the starting programming voltage or the verify levels. This may be done as a function of the programming temperature.

In response to the comparator 132 determining that a measured temperature 140 has reduced from being a higher than the first threshold 142 to being less than or equal to the second threshold 144, the comparator 132 may indicate to the controller 120 that marked data is to be refreshed (e.g., the second threshold 144 may be equal to the first threshold 142 or may be less than the first threshold 142). For example, the controller 120 may access the marked data list 126 and, for each entry in the marked data list 126, the controller 120 may instruct a data read of data corresponding to the entry from the memory 104 and a subsequent data write of the data to the memory 104. The controller 120 may cause the ECC engine 170 to perform a data error correction operation to correct one or more errors that may occur in the data prior to storing the data back to the memory 104 at the lower temperature.

The range adjuster 138 may be configured to adjust one or more temperature thresholds, such as the first threshold 142 and the second threshold 144, based on the temperature history 130. For example, when the temperature history 130 indicates that a "normal" historical operating temperature range of the data storage device 102 has increased since setting the first threshold 142, the range adjuster 138 may adjust a value of the first threshold 142. Similarly, the range adjuster 138 may adjust one or more other temperature thresholds based on a history of the temperature measurements associated with the memory device 103. An example of range adjustment is described with reference to FIG. 2.

By performing one or more adjustments based on the difference between a write temperature and a read temperature of data stored at the memory 104, based on whether a write temperature is outside of a normal temperature range, or based on one or more other temperature related factors, an accuracy of reading data from the memory 104 may be increased. As a result, data correction provided by the ECC engine 170 may be enhanced, enabling a less powerful ECC engine to be used to accomplish an equivalent amount of data correction. Alternatively, or in addition, an increased error correction capability and therefore an increased useful life of the data storage device 102 may be obtained.

Figure 2:
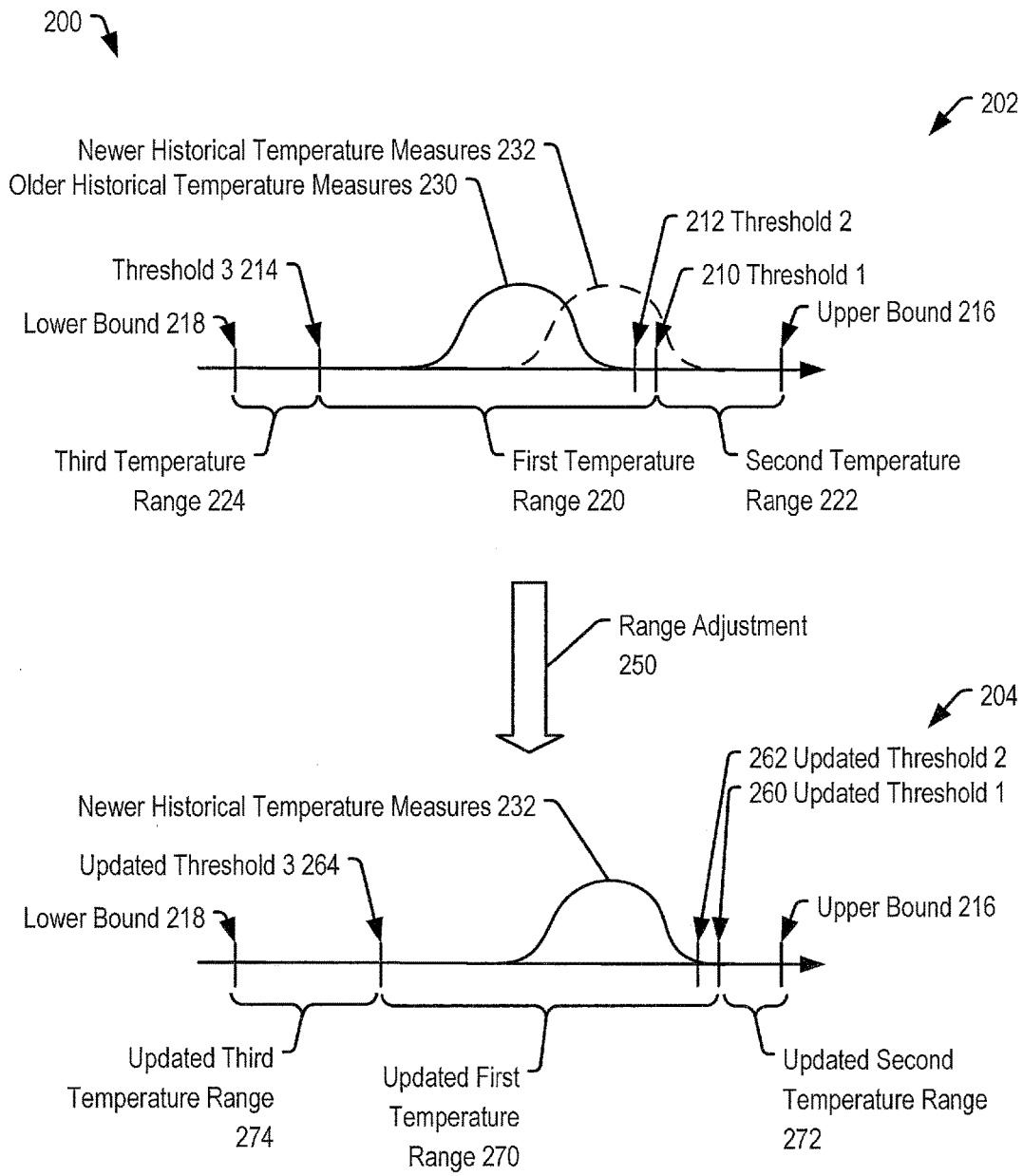
FIG. 2 is a diagram illustrating a particular examples of temperature ranges associated with the data storage device of FIG. 1.

Referring to FIG. 2, an example 200 of performing temperature range adjustment is depicted. For example, a first graph 202 may indicate a distribution of historical temperature measures 230 associated with storage of data or retrieval of data from the memory device 103 of FIG. 1. As illustrated, the historical temperature measures 230 may be considered an "older" set of historical temperature measures as compared to a "newer" (e.g., more recent) set of historical temperature measures 232. Based on the older historical temperature measures 230, three or more temperature ranges may be determined, such as a first temperature range 220, a second temperature range 222, and a third temperature range 224.

For example, the first temperature range 220 may correspond to a "normal" temperature range. The second temperature range 222 may correspond to an "abnormal" temperature range of temperatures that exceed a highest temperature of the first temperature range 220. The third temperature range 224 may be considered an "abnormal" temperature range of temperatures that are less than the first temperature of the first temperature range 220.

The first temperature range 220 may have an upper boundary indicated by a first threshold 210. For example, the first threshold 210 may correspond to the first threshold of FIG. 1. A second threshold 212 is also illustrated, which may correspond to the second threshold 144 of FIG. 1. Temperatures exceeding the first threshold 210 may be considered to be in the "abnormal" temperature range indicated by the second temperature range 222. The second temperature range 222 may have an upper bound 216, beyond which reliability of the data storage device 102 may be jeopardized. For example, design of the data storage device 102 may be determined to satisfy performance based metrics when operating at a temperature between the upper bound 216 and a lower bound 218. A third threshold 214 may indicate a boundary between the first temperature range 220 and the third temperature range 224.

In response to the range adjustment 250 determining that the distribution of newer historical temperature measures 232 includes a portion of measurements, the range adjuster 138 may adjust one or more of the thresholds 210-214. For example, as depicted in the second graph 204, the range adjustment 250 may result in the first threshold 210 being increased to a first updated threshold 260. The first updated threshold 260 may be positioned such that a particular percentage of the newer historical temperature measures 232 are at lower temperatures than the first updated threshold 260. For example, the first updated threshold 260 may be selected so that one percent, two percent, one-half of a percent, 10 percent, or any other portion of the newer historical temperature measures 232 exceed the first updated threshold 260.

The second updated threshold 262 may also be adjusted. For example, an offset amount that is applied to the first threshold 210 to generate the first updated threshold 260 may also be applied to the second threshold 212 to generate the second updated threshold 262. Alternatively, one or more or other techniques may be used to determine the second updated threshold 262, such as by selecting the second updated threshold 262 based on a proportion of the newer historical measurement measures 232 being greater than the second updated threshold 262.

Increasing the first updated threshold 260 may decrease the second temperature range 222 to form a second updated temperature range 272. The first temperature range 220 may be updated to form the first updated temperature range 270 that spans from the first updated threshold 260 to a third updated threshold 264. For example, as illustrated, the first temperature range 220 may be shifted based on the shift of the first threshold 210 to the first updated threshold 260. Thus, a temperature difference between the first updated threshold 260 and the third updated threshold 264 may be equal to a temperature difference between the first threshold 210 and the third threshold 214.

The third temperature range 224 may be adjusted to form the updated third temperature range 274. For example, the lower bound 218 may remain unadjusted, and the updated third temperature range 274 may span between the lower bound 218 and the third updated threshold 264.

Because temperature effects on data storage and retrieval may be primarily based on a temperature difference between write temperatures and read temperatures, by adjusting the temperature ranges 220-224 based on a recent history of historical temperature measures, a proportion of data write and/or data reads occurring in the abnormal temperature range(s) may be reduced, resulting in a higher performance and lower error rates as compared to operation using the unadjusted temperature ranges 220-224.

FIG. 3 depicts an example 300 of an implementation that may be used in the data storage device 102 of FIG. 1. An adjusted read voltage may be generated by or based on a sum of a default value of the read voltage 301 and an offset retrieved from an offset table 302. For example, in the offset table 302 may correspond to the table 128 of FIG. 1. The offset table 302 includes multiple columns, each column corresponding to a respective read temperature range. The offset table 302 also includes a number of rows, each row corresponding to a respective write temperature range.

An example of temperature ranges that may be used as the read temperature ranges and the write temperature ranges is depicted in a range table 304. For example, range 0 may span from a temperature of −25 degrees (e.g., degrees Celsius) to a temperature of 0 degrees. Range 1 may correspond to a temperature in the range from one degree to 25 degrees. Range 2 may correspond to a temperature between 26 and 50 degrees. Range 3 may correspond to a temperature from 51 degrees to 75 degrees. Range 4 may correspond to a temperature from 76 degrees to 100 degrees.

As illustrated, the offset table 302 omits values for entries that correspond to matching temperature ranges and read temperature ranges. For example, an entry of the offset table 302 corresponding to a read temperature in range 1 and a write temperature in range 1 includes a value "N/A", meaning that the entry may be omitted from the table, may be empty of data, or may include zero values (e.g., zero offset to the default value 301). Other entries of the offset table 302 include offset values that may be negative values or may be positive values. When the read temperature range corresponds to a lower temperature range than the write temperature range, the offset stored in the table entries may have negative values, such as Offset_Neg_1. Similarly, for table entries where the write temperature range exceeds the read temperature range, values in the table entries may be positive, such as Offset_Pos_1.

As illustrated, for five temperature ranges, a total of four negative offset values and four positive offset values may be used. Thus, a reduced amount of data may be used to adjust for differences in read temperature ranges using a relatively small amount of offset data as compared to including a distinct offset value for each temperature difference. Although the offset table 302 is illustrated as having a table format, in other implementations the values of Offset_Pos_1-4 and Offset_Neg_1-4 may be stored in a data structure having a non-table format and may be selectively accessed based on differences between the read temperature range and the write temperature range.

Figure 4:
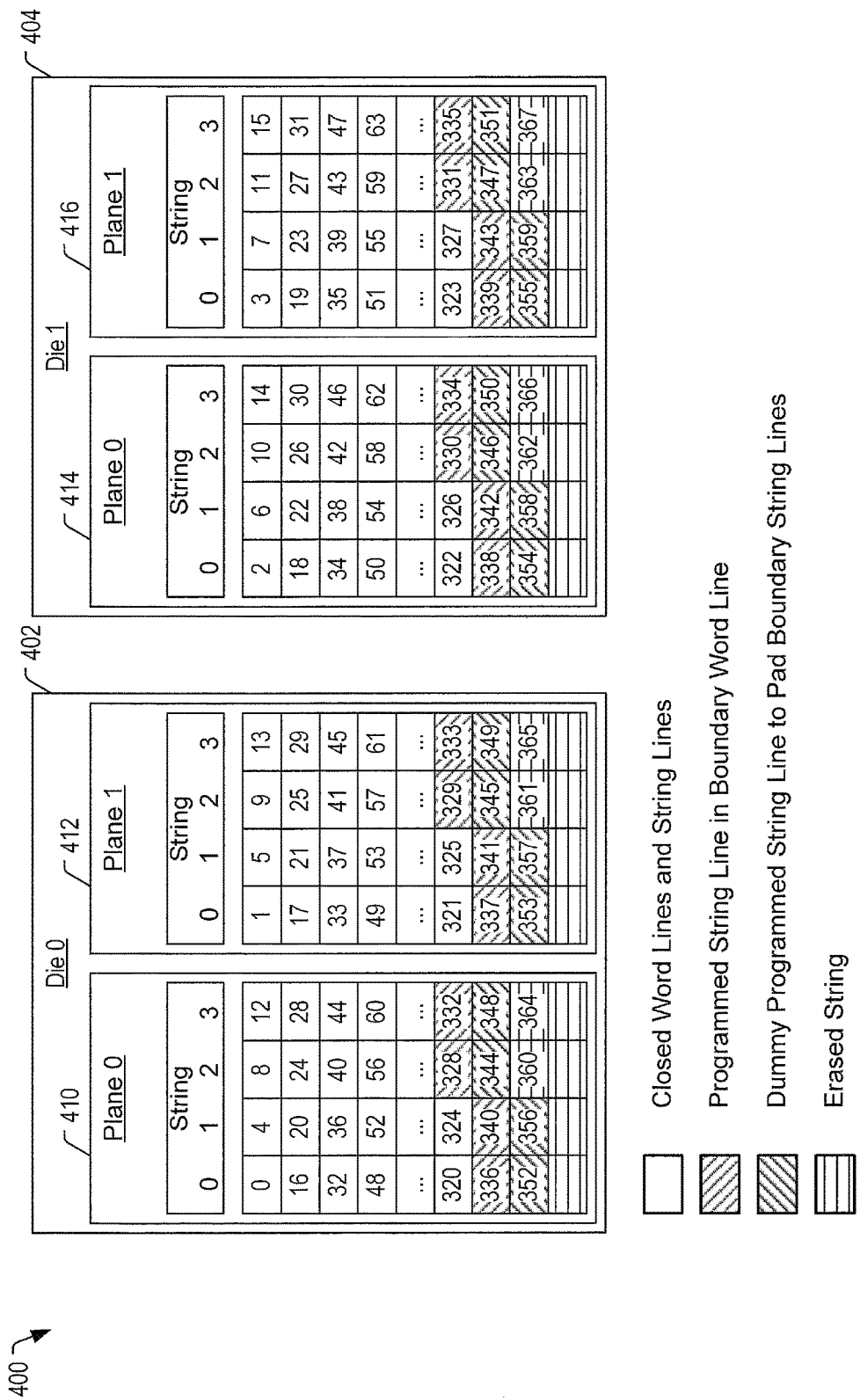
FIG. 4 is a diagram illustrating a particular example of a first configuration of multiple memory dies of the data storage device of FIG. 1.

FIG. 4 illustrates an example 400 of the memory device 103 of FIG. 1 after the controller 120 has closed partially written open blocks in response to programming temperature changes exceeding a threshold amount. For example, data written to the memory device 103 may be striped across multiple dies including a first die 402 and a second die 404. The first die 402 may include a first plane 410 and a second plane 412, and the second die 404 may include a first plane 414 and a second plane 416. Each of the planes 410-416 may include multiple strings, illustrated as string 0, string 1, string 2 and string 3. Each string may correspond to a physical page and may be sized to include a sufficient number of storage elements of the memory 104 to store a sector of data, such as an ECC codeword. Each plane 410-416 is illustrated as including a single representative block having 24 word lines and that may be operated as a 4-block "metablock" by the controller. Although a single block is illustrated for each plane 410-416, it should be understood that each plane 410-416 may have any number of blocks.

Data may be stored to the memory device 103 according to an order of page writes indicated as page numbers within the respective planes 410-416. For example, a first page of data ("page 0") may be written to string 0 of the first plane 410 of the first die 402. A second page of data may be written to a first string of the second plane 412 of the first die 402. A third page of data may be written to a first string of the first plane 414 of the second die 404, and a fourth page of data may be written to a first string of the second plane 416 of the second die 404.

As data is received from the access device 180 to be stored at the memory device 103, the controller 120 may monitor a temperature and compare a change in temperature to a block variation threshold. For example, in response to detecting a temperature change that exceeds a block variation threshold after writing data to a block, such as a the illustrated block of the second plane 416 of the second die 404 that includes the data storing page 327, the controller 120 may be configured to close the block to prevent further write operations to an unused portion of the block (or of the multiple blocks when operated as a metablock). For example, each block may initially include all erased word lines, and as data is received, the word lines may be written as illustrated in FIG. 4, until page 327 is written to the memory. Upon writing page 327, a temperature measurement associated with page 327 may exceed a temperature measurement associated with writing page 0 to the memory 104 by more than a block variation threshold. In response to detecting the temperature change between writing page 327 and writing page 0 has exceeded the block variation threshold, the controller 120 may be configured to write dummy data to pages labeled 344-359 to form a boundary that isolates the last written valid data of each block, illustrated as pages 328-343, from erased word lines that remain unwritten after closing the block.

By writing the dummy data to the boundary word lines, an enhanced data retention may be maintained upon closing the block. By closing the block when the temperature variation has exceeded the threshold, reading data from the block may be accomplished using a common set of read parameters, without having to adjust read parameters for different word lines of the block. Thus, by constraining a write temperature range for data written to the blocks, a parameter adjustment range for data read from the block may be reduced.

Figure 5:
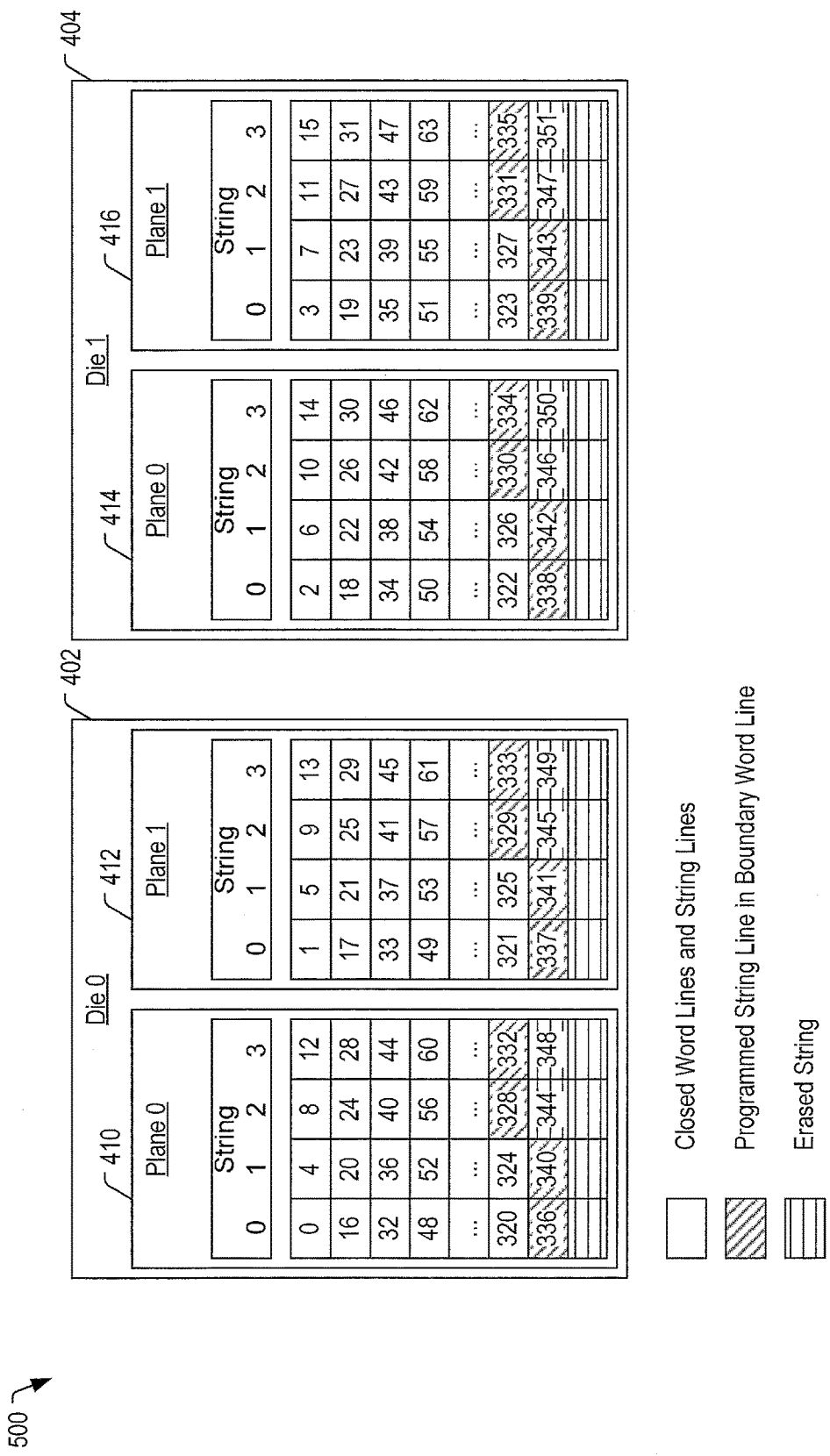
FIG. 5 is a diagram illustrating a particular example of a second configuration of multiple memory dies of the data storage device of FIG. 1.

FIG. 5 depicts another example of closing one or more blocks in response to the temperature variation within the block exceeding a particular amount. The example 500 differs from the example 400 in that the controller 120 does not write dummy data at the boundary following the last valid data written to the memory 104. Although closing the block according to the example 500 may be performed more quickly than the example 400 because less data is written (i.e., the dummy data is omitted), an improved data retention and reduced error rate may be obtained in the example 400 by use of the dummy data.

Figure 6:
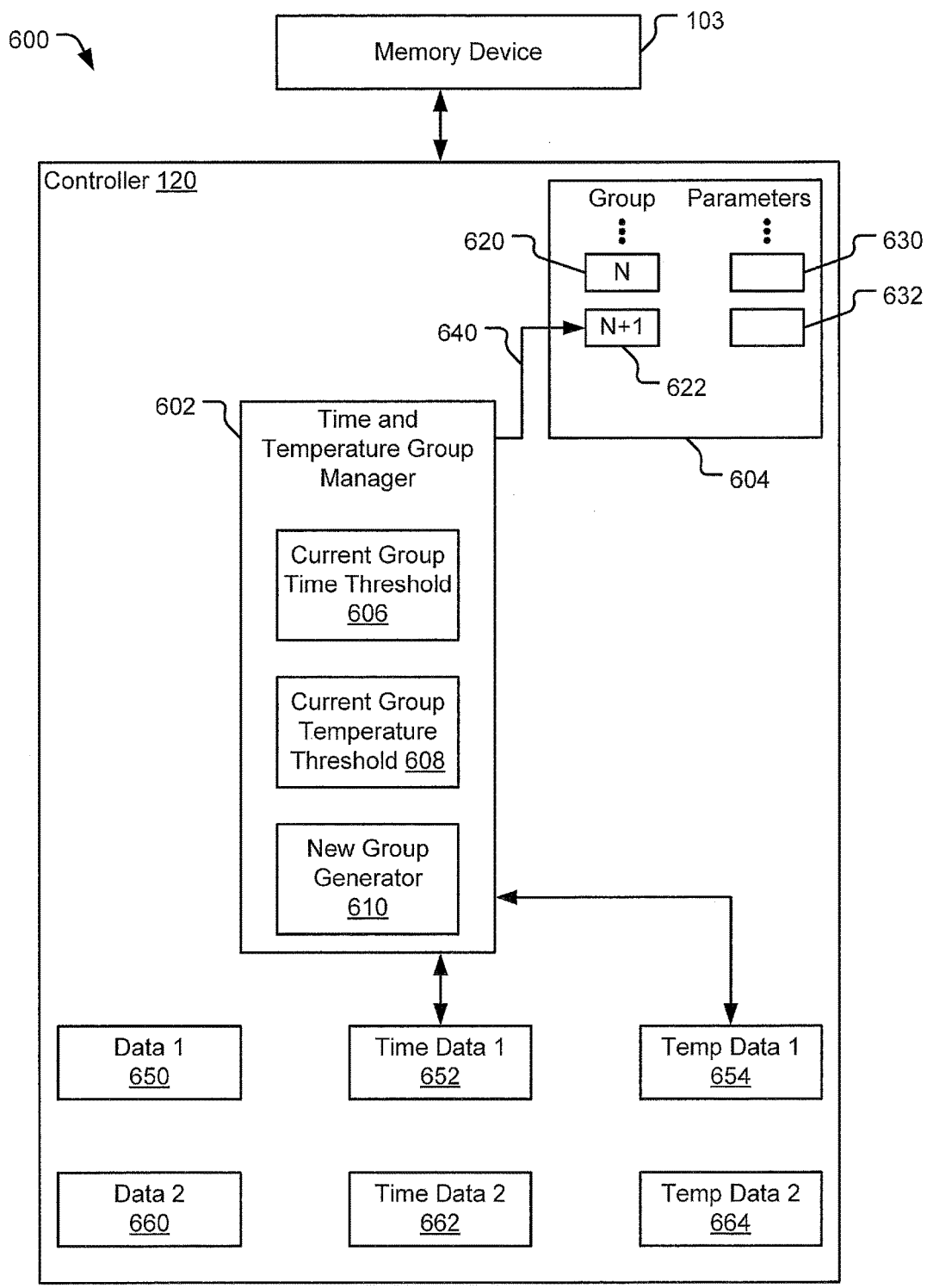
FIG. 6 is a block diagram of an illustrative example of the data storage device of FIG. 1.

FIG. 6 depicts an example of a system 600 that may be implemented in the data storage device 102 of FIG. 1. For example, the system 600 includes the memory device 103 and the controller 120 of FIG. 1. The controller 120 includes a time and temperature group manager 602 that is configured to access a data structure 604, such as a table or array that associates indicators of groups of data to memory access parameters associated with the groups of data. For example, a group of data 620 labeled group "N" may be associated with a first set of access parameters 630, such as a first set of read voltage parameters, a first set of write voltage parameters, a first set of erase parameters, or combination thereof. A second group indicator 622 is labeled group "N+1" and is associated with a second set of memory access parameters 632.

The time and temperature group manager 602 may be configured to maintain a group indication pointer 640 that indicates a current group to be used as storage data to the memory device 103. For example, when the group indication pointer 640 points to group indicator N 620, data received from the access device 180 to be stored in the memory device 103 may be associated with group N and the first set of parameters 630 may be used for data write and data retrieval at the memory device 103. The time and temperature group manager 602 may be configured to update the group indication pointer 640 to point to a next group based on detecting one or more events.

For example, a group may have a time threshold 606 that is compared against a time measurement (e.g., a current time). In response to the current time exceeding the current group time threshold 606, the time and temperature group manager 602 may cause a new group to be generated by a new group generator 610. Alternatively, or in addition, an upper and/or lower temperature range of the current group may be indicated based on a current group temperature threshold 608. For example, when the current group is created, a measured temperature of the memory device 103 may be obtained and used to generate a current group temperature threshold 608. For example, the current group temperature threshold 608 may be used to constrain an amount of temperature variation that occurs while data is written. For example, the current group may be constrained to a particular temperature range, such as a 20 degree range that is centered on a write temperature for the group.

To illustrate, when a new group is created, a temperature T_new of the memory device 103 may be measured. An upper temperature T_hi for the group may be computed as T_hi=T_new+10, and an lower temperature T_lo for the group may be computed as T_lo=T_new+10. The current group temperature threshold 608 may include multiple elements (e.g., a vector) including T_lo and T_hi. In this case, the current group temperature threshold is "exceeded" when a measured temperature is greater than T_hi or when the measured temperature is less than T_lo. In other implementations, the current group temperature threshold 608 may represent a difference threshold, such as 10 degrees, and may be "exceeded" when an absolute value of a difference between a measured temp T_meas and T_new (e.g., |Tmeas−Tnew|) is greater than the difference threshold.

The new group generator 610 may be configured to populate a next group indicator and a next set of memory access parameters in the data structure 604. For example, when the current group is group N 620 and the current group time threshold 606 or the current group temperature threshold 608 is exceeded, the time and temperature group manager 602 may cause the new group generator 610 to generate the new group indicator N+1 622 and to determine the second memory access parameters 632 associated with group N+1.

During operation, the group indication pointer 640 may point to the first group indicator 620. Data that is received at the controller 120 to be written to the memory device 103 may be associated with time data and temperature data. For example, first data 650 may be received, associated with first time data 652 and first temperature data 654. For example, the first time data 652 may correspond to a chronological time, a count of memory accesses or write/erase cycles, a memory health metric, a count of power cycles, or some other indicator of time passage or memory usage. The first temperature data 654 may be received from a temperature sensor of the memory device 103, such as the temperature sensor 112 of FIG. 1. The time and temperature group manager 602 may compare the first time data 652 to the current group time threshold 606 and compare the first temperature data 654 to the current group temperature threshold 608. In response to determining that the first time data 652 does not exceed the current group time threshold 606 and that the first temperature data 654 does not exceed the current group temperature threshold 608, the time and temperature group manager 602 may associate the first data 650 with the current group N, and may provide the first access memory parameter 630 to the memory device 103 for storage of the first data 650.

After storing the first data 650, the controller 120 may receive second data 660 associated with second time data 662 and second temperature data 664. Although the second time data 662 may not exceed the current group time threshold 606, the second temperature data 664 may exceed the current group temperature threshold 608.

In response to determining that the second temperature data 664 exceeds the current group temperature data 608, the time and temperature group manager 602 may generate a new group N+1, may generate the second group indicator 662, may determine the second memory access parameters 632, and may provide the second memory access parameters 632 to the memory device 103 for storing the second data 660 to the memory device 103. In addition, the time and temperature group manager 602 may update the group indication pointer 640 to point to the second group indication 662.

Another method that may be used for deciding whether to open a new time and temperature tag (e.g., create a new group with a new group indicator) is that whenever new data is programmed (e.g., a new block) then the block may be read with the read parameters associated with the current time & temperature tag. In case the BER measured for the read result does not fit to the BER indicated by the time & temperature tag, then a new time & temperature group may be created and the current block may be associated with the new group. For example, in cases where there was a power drop at the data storage device, and when the memory is powered up again, the data storage device may not know how much time has elapsed. Thus, the controller may be configured to check whether the parameters associated the last time & temperature group/tag fit the newly programmed block.

By constraining the group associated with data to be within a common time range and also within a common temperature range, an applicability of the memory access parameters associated with the group may be maintained. For example, a variation of data characteristics of the memory device 103 may remain relatively constrained such that the memory access parameters associated with the group may enable reliable reading and writing of data using the memory access parameters for the group. Adjustment of the memory access parameters, such as due to device usage or in response to temperature variation of the data storage device, may be performed by adjustment of the memory access parameters associated with the groups as opposed to adjustment of memory access parameters for individual data accesses to the memory device 103. This may be done by calibrating the parameters on representative pages of the group, instead of calibrating them on each page within the group, thus saving time and reducing maintenance complexity. The updating of the parameters of the different time and temperature groups may be done as maintenance operations performed in the background. Alternatively, the updating of parameters may be triggered by some event in the foreground (e.g. high BER observed during a host read).

Figure 7:
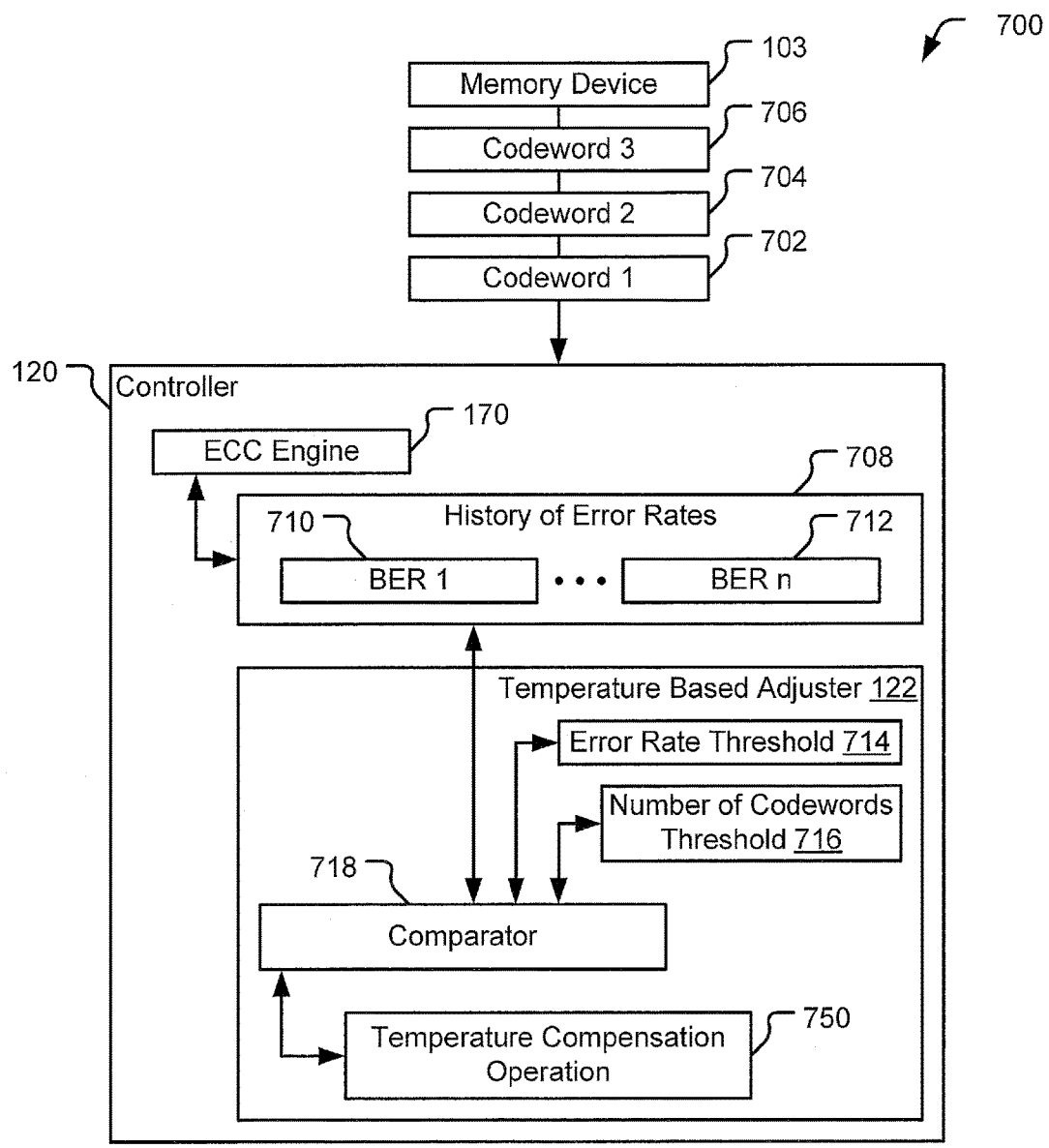
FIG. 7 is a block diagram of another illustrative example of the data storage device of FIG. 1.

FIG. 7 is a block diagram of another illustrative example of the data storage device of FIG. 1. FIG. 7 illustrates a data storage device 700 that includes the memory device 103 that is coupled to the controller 120. The memory device 103 and the controller 120 may include or correspond to the memory device 103 and the controller 120 of FIG. 1.

The controller 120 may include the ECC engine 170 and the temperature-based adjuster 122. The controller 120 may be configured to read multiple codewords of data from the memory device 103. For example, the controller 120 may be configured to read a first codeword 702, a second codeword 704, and a third codeword 706 from the memory device 103. In other implementations, more than three codewords or fewer than three codewords may be read from the memory device 103.

The controller 120 may be configured to determine an error rate associated with reading the multiple codewords of data. For example, the ECC engine 170 of the controller 120 may be configured to determine a first error rate (e.g., a first bit error rate (BER)) associated with reading the first codeword 702, a second error rate associated with reading the second codeword 704, and a third error rate associated with reading the third codeword 706. The controller 120 may be configured to maintain determined error rates as history of error rates data 708 that includes multiple error rates (e.g., multiple BERs). For example, the ECC engine 170 of the controller 120 may be configured to maintain the history of error rates data 708 (e.g., in a controller memory) that includes a first error rate 710 (e.g., BER 1) and an n-th error rate 712 (e.g., BER n). The number n of error rates included in the history of error rates data 708 may correspond to the number of codewords read from the memory device 103 during a particular operation (or set of operations).

The temperature-based adjuster 122 of the controller 120 may be configured to compare the error rate to a threshold error rate for a threshold number of codewords. For example, the temperature-based adjuster 122 may include a comparator 718 that is configured to compare one or more error rates from the history of error rates data 708 to an error rate threshold 714. In a particular implementation, the error rate threshold 714 is less than a threshold correctable error rate of the ECC engine 170. In response to determining that error rates exceed the error rate threshold 714 for a number of sequential codewords that exceeds a number of codewords threshold 716, the temperature-based adjuster 122 may initiate a temperature compensation operation 750. To illustrate, the number of codewords threshold 716 may be three, and in response to detecting that the first error rate 710 (corresponding to the first codeword 702), a second error rate (corresponding to the second codeword 704), and the n-th error rate 712 (corresponding to the third codeword 706) each exceed the error rate threshold 714, the temperature-based adjuster 122 may initiate the temperature compensation operation 750. The temperature compensation operation 750 may cause one or more memory access parameters (such as the read voltage 164 of FIG. 1) to be modified based on a temperature difference between a first temperature associated with writing the multiple codewords 702-706 to the memory device 103 (e.g., the first temperature is associated with a first time period, the first time period includes a write operation of the multiple codewords 702-706 to the memory 104), and a second temperature associated with reading the multiple codewords 702-706 from the memory device 103 (e.g., the second temperature is associated with a second time period, the second time period includes a read operation of multiple codewords 702-706 from the memory 104).

During operation, the controller 120 may read multiple codewords including the first codeword 702, the second codeword 704, and the third codeword 706 from the memory device 103. The controller 120 (e.g., the ECC engine 170) may detect error rates associated with the codewords 702-706. The error rates may be included in the history of error rates data 708. The controller 120 (e.g., the temperature-based adjuster 122) may compare the history of error rates data 708 to the error rate threshold 714. In response to detecting that error rates exceed the error rate threshold 714 for a number of sequential codewords that exceeds the number of codewords threshold 716, the controller 120 may initiate the temperature compensation operation 750 that modifies one or more memory access parameters based on a temperature difference between a first temperature associated with writing the multiple codewords 702-706 to the memory device 103 and a second temperature associated with reading the multiple codewords 702-706 from the memory device 103.

Figure 8:
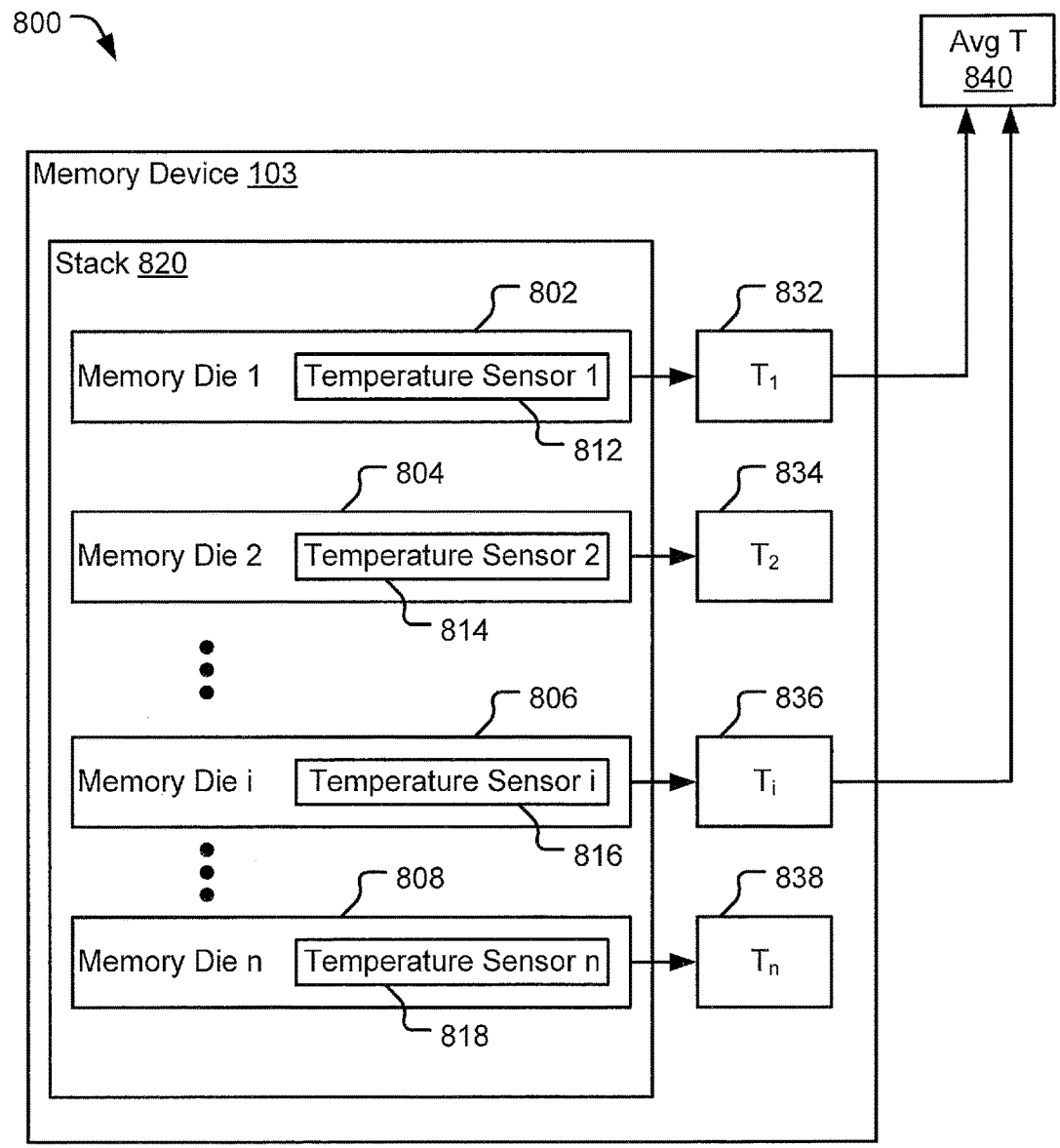
FIG. 8 is a diagram illustrating a particular example of a configuration of a memory device of the data storage device of FIG. 1.

FIG. 8 is a diagram illustrating a particular example of a configuration of a memory device of the data storage device of FIG. 1. FIG. 8 illustrates a data storage device 800 that includes the memory device 103. The memory device 103 may include or correspond to the memory device 103 of FIG. 1.

The memory device 103 includes a stack 820 of memory dies. The stack 820 may include multiple memory dies, such as a first memory die 802, a second memory die 804, an i-th memory die 806, and an n-th memory die 808. In other implementations, the stack 820 may include more than n or fewer than n memory dies. In a particular implementation, the first memory die 802 is a top die of the stack 820, the n-th memory die 808 is a bottom memory die of the stack 820, and other memory dies such as the second memory die 804 and the i-th memory die 806 are "central" memory dies of the stack 820. As used herein, central memory dies refer to memory dies that are neither the top memory die nor the bottom memory die of the stack 820, such as to dies in a center of a stack, e.g., die 3 in a 5-die stack or dies 4 and 5 in an 8-die stack.

Each memory die of the stack 820 may include a corresponding temperature sensor. For example, the first memory die 802 may include a first temperature sensor 812, the second memory die 804 may include a second temperature sensor 814, the i-th memory die 806 may include an i-th temperature sensor 816, and the n-th memory die 808 may include an n-th temperature sensor 818. Each temperature sensor of the temperature sensors 812-818 may be configured to generate an indicator of a temperature of the corresponding memory die. For example, the first temperature sensor 812 may be configured to generate a first indicator 832 (T1) of a first temperature of the first memory die 802, the second temperature sensor 814 may be configured to generate a second indicator 834 (T2) of a second temperature of the second memory die 804, the i-th temperature sensor 816 may be configured to generate a third indicator 836 (T3) of a third temperature of the i-th memory die 806, and the n-th temperature sensor 818 may be configured to generate a fourth indicator 838 (T4) of a fourth temperature of the n-th memory die 808. The memory device 103 may be configured to provide the indicators 832-838 to the controller for processing.

The controller may be configured to receive multiple indicators from the memory device 103 and to determine an average based on the multiple indicators. For example, the controller may be configured to receive the first indicator 832 of the first temperature from the first temperature sensor 812 and the third indicator 836 of the third temperature from the i-th temperature sensor 816. The controller may be configured to determine an average temperature 840 of the first temperature and the third temperature. In this manner, the average temperature may be determined based on a temperature of a non-center memory die (e.g., the first memory die 802) and a central memory die (e.g., the i-th memory die 806). Because the first memory die 802 is the coolest and the central die (e.g., the i-th memory die 806) is the hottest, the average temperature 840 may be representative of a range of temperatures of memory dies in the stack 820.

In some implementations, the average temperature 840 may be further based on indications (e.g., the second indication 834, the n-th indication 838, or both) of temperatures of other memory dies. As non-limiting examples, the average temperature 840 may be determined based on the first indicator 832 and the second indicator 834, the n-th indicator 838 and the second indicator 834, the n-th indicator 838 and the i-th indicator 836, or some other combination of two or more of the indicators 832-838. The average temperature 840 may include or correspond to a mean temperature, a weighted mean temperature, a median temperature, a mode of the temperatures, or another statistical measure of central accuracy. The controller may be further configured to determine a temperature range associated with a memory access based on the average temperature 840. In other implementations, the memory device 103 may be configured to perform the above-described actions of the controller. For example, the memory device 103 may determine the average temperature 840 and a temperature range of the stack 820 based on the average temperature 840.

During operation, temperature sensors of memory dies of the stack 820 may generate indications of a temperature of a corresponding memory die. For example, the first temperature sensor 812 may generate the first indicator 832 of the first temperature of the first memory die 802, the second temperature sensor 814 may generate the second indicator 834 of the second temperature of the second memory die 804, the i-th temperature sensor 816 may generate the third indicator 836 of the third temperature of the i-th memory die 806, and the n-th temperature sensor 818 may generate the fourth indicator 838 of the fourth temperature of the n-th memory die 808. The controller (e.g., the controller 120 of FIG. 1) may receive indicators from the memory device 103 and may determine the average temperature 840. For example, the controller may receive the first indicator 832 of the first temperature and the i-th indicator 836 of the third temperature and the controller may determine the average temperature 840 for the first and third temperatures. The controller may determine a temperature range associated with a memory access based on the average temperature 840. In another implementation, the memory device 103 may determine the temperature range and the average temperature 840, and the memory device 103 may send an indication of the temperature range to the controller.

Figure 9:
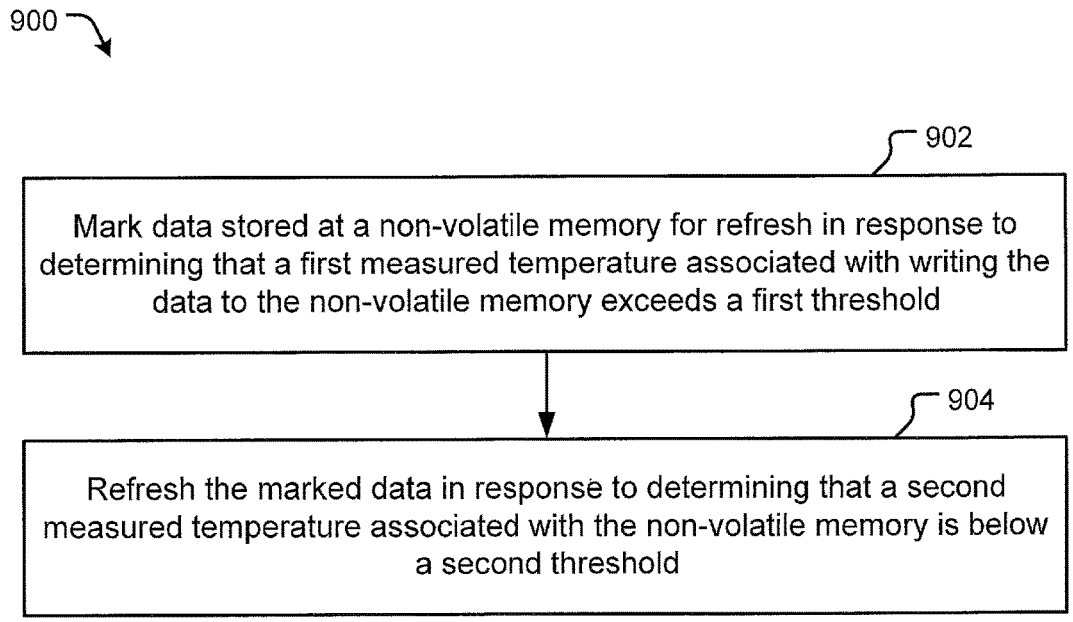
FIG. 9 is a flow diagram of a particular example of a method of refreshing data that may be performed by the data storage device of FIG. 1.

FIG. 9 is a flow diagram of a particular example of a method 900 of refreshing data. The method 900 may be performed at a data storage device that includes a controller and a non-volatile memory. For example, the method 900 may be performed by the data storage device 102 of FIG. 1.

The method 900 includes, at 902, marking data stored at the non-volatile memory for refresh in response to determining that a first measured temperature associated with writing the data to the non-volatile memory exceeds a first threshold. For example, the temperature-based adjuster 122 of FIG. 1 may determine that the write temperature 108 (e.g., a first measured temperature associated with writing the data 106 to the memory 104) exceeds the first threshold 142. In this example, in response to determine that the write temperature 108 exceeds the first threshold 142, the temperature-based adjuster 122 may mark the data 106 by storing the refresh flag 110. Alternatively or in addition, the temperature-based adjuster 122 may store an indicator (or an identifier) of the data 106 in the marked data list 126.

The method 900 includes, at 904, refreshing the marked data in response to determining that a second measured temperature associated with the non-volatile memory is below a second threshold. For example, the temperature-based adjuster 122 of FIG. 1 may receive the measured temperature 140 (e.g., the second measure temperature) from the temperature sensor 112. In this example, the comparator 132 may compare the measured temperature 140 to the second threshold 144. If a value of the measured temperature 140 is below a value of the second threshold 144, the temperature-based adjuster 122 may cause the marked data to be refreshed. To illustrate, if the value of the measured temperature 140 is below a value of the second threshold 144, the controller 120 may access the marked data list 126 to identify marked data. The controller 120 may also initiate data refresh operations, such as by sending the command 160 to cause the data 106 to be refreshed.

Figure 10:
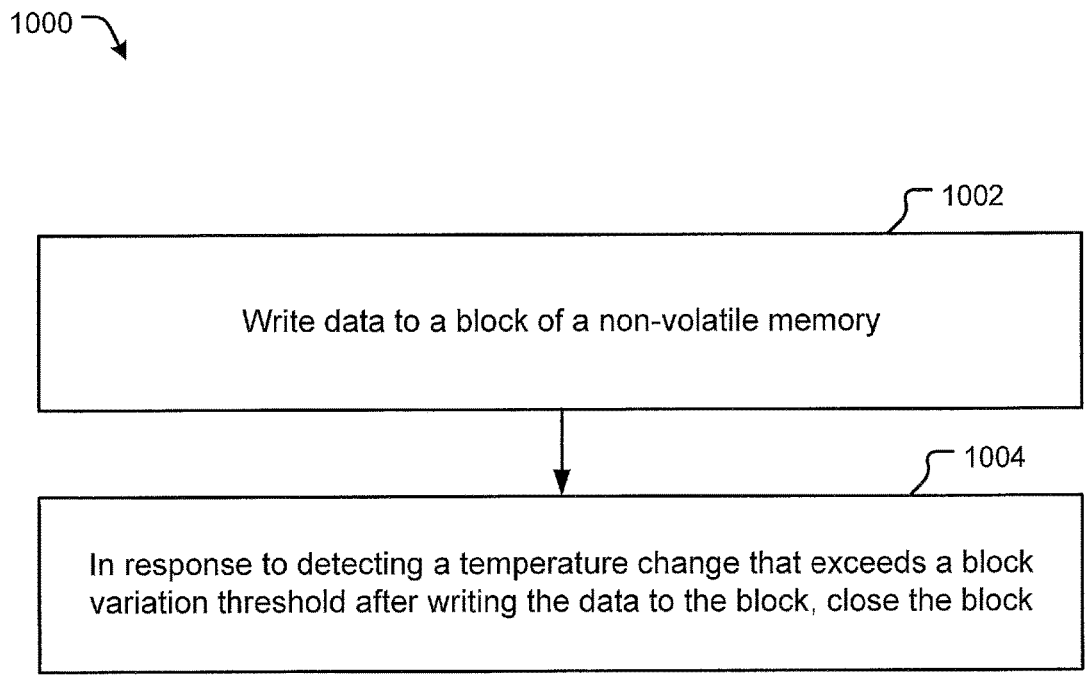
FIG. 10 is a flow diagram of a particular example of a method of temperature-based control that may be performed by the data storage device of FIG. 1.

FIG. 10 is a flow diagram of a particular example of a method 1000 of temperature-based control. The method 1000 may be performed at a data storage device that includes a controller and a non-volatile memory. For example, the method 1000 may be performed by the data storage device 102 of FIG. 1.

The method 1000 includes, at 1002, writing data to a block of the non-volatile memory. For example, the data 106 of FIG. 1 may be written to a particular block of the memory 104.

The method 1000 also includes, at 1004, in response to detecting a temperature change that exceeds a block variation threshold after writing the data to the block, closing the block. For example, the temperature-based adjuster 122 may detect a temperature change (e.g., based on the measured temperature 140 and the temperature history 130). The comparator 132 may determine whether the temperature change exceeds a threshold. In response to determining that the temperature change exceeds a threshold, the controller 120 may close the block, such as described with reference to FIGS. 4-5. Closing the block may prevent write operations to an unused portion of the block. In some implementations, the controller 120 may write dummy data to a word line of the block prior to closing the block.

Figure 11:
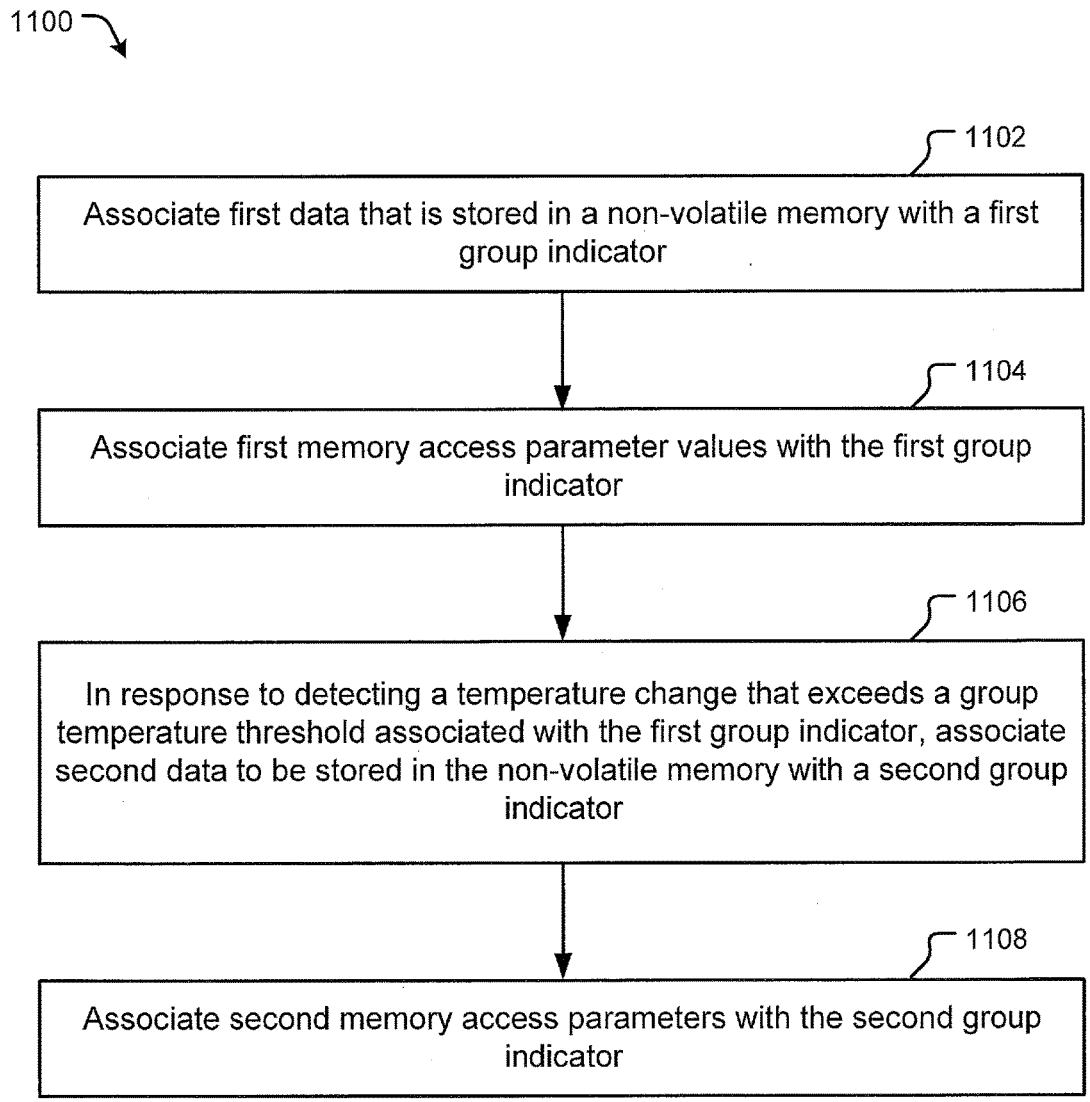
FIG. 11 is a flow diagram of another particular example of a method of temperature-based control that may be performed by the data storage device of FIG. 1.

FIG. 11 is a flow diagram of another particular example of a method 1100 of temperature-based control. The method 1100 may be performed at a data storage device that includes a controller and a non-volatile memory. For example, the method 1100 may be performed by the data storage device 102 of FIG. 1.

The method 1100 includes, at 1102, associating first data that is stored in the non-volatile memory with a first group indicator, and, at 1104, associating first memory access parameter values with the first group indicator. For example, the time and temperature group manager 602 of FIG. 6 may associate the first data 650 with the first group 620. The time and temperature group manager 602 may also associate the first parameters 630 with the first group 620.

The method 1100 also includes, at 1106, in response to detecting a temperature change that exceeds a group temperature threshold associated with the first group indicator, associating second data to be stored in the non-volatile memory with a second group indicator, and, at 1108, associating second memory access parameters with the second group indicator. For example, the time and temperature group manager 602 of FIG. 6 may detect a temperature change (e.g., by comparing the first temperature data 654 and the second temperature data 664 to a first stored temperature for the first group 620). If the temperature change exceeds the current group temperature threshold 608, the time and temperature group manager 602 may generate a new group (e.g., the second group 622) and may associate the second data 660 with the second group 622. The time and temperature group manager 602 may also associate the second parameters 632 with the second group 622.

In a particular implementation, the time and temperature group manager 602 may store the group indicator pointer 640 which may indicate a group indicator (e.g., an indicator of the first group 620 or an indicator of the second group 622) to be associated with data (e.g., data received from the access device 180) that is to be written to the non-volatile memory. In this particular implementation, in response to detecting the temperature change, the time and temperature group manager 602 may update the group indicator pointer 640 to indicate the indicator of the second group 622.

Figure 12:
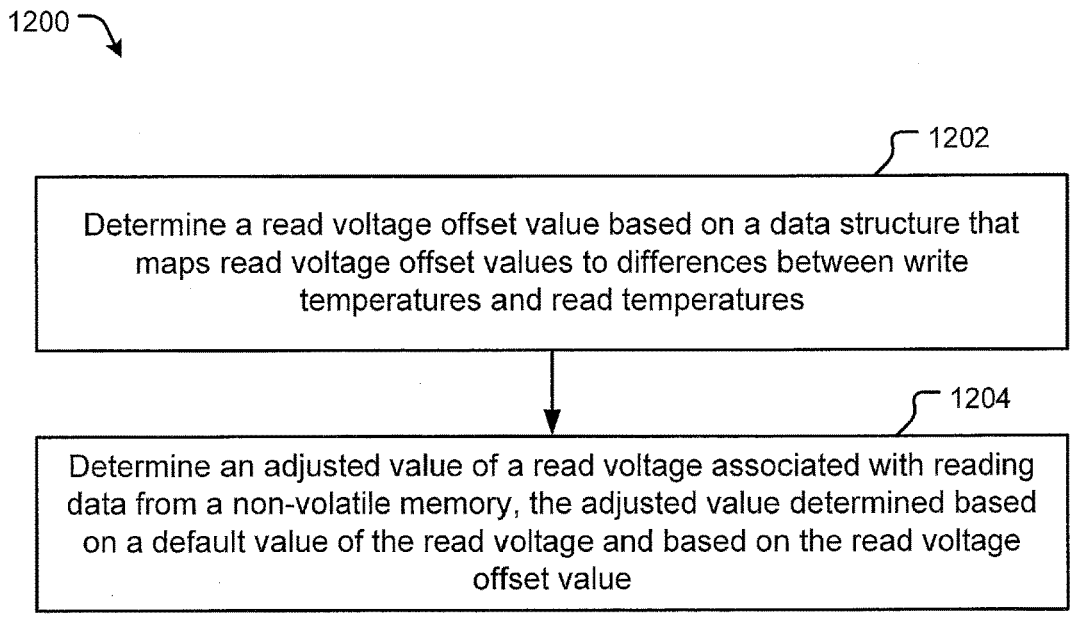
FIG. 12 is a flow diagram of another particular example of a method of determining a read voltage value that may be performed by the data storage device of FIG. 1.

FIG. 12 is a flow diagram of another particular example of a method 1200 of determining a read voltage value. The method 1200 may be performed at a data storage device that includes a controller and a non-volatile memory. For example, the method 1200 may be performed by the data storage device 102 of FIG. 1.

The method 1200 may include, at 1202, determining a read voltage offset value based on data structure that maps read voltage offset values to differences between write temperatures and read temperatures. For example, the data structure may include the table 128 and temperature-based adjuster 122 may perform a lookup operation to read the table 128 to determine a read voltage offset value, such as the first read voltage offset value 152, that corresponds to a particular temperature difference, such as the first temperature difference 150.

In a particular implementation, each entry of the table is accessible according to a write temperature range and a read temperature range. In this particular implementation, the table omits read voltage offset values for entries that correspond to matching write temperature ranges and read temperature ranges. For example, an offset value can be determined from the offset table 302 based on a write temperature range and a read temperature range. Further, the offset table 302 omits read voltage offset values for table entries that correspond to matching write temperature ranges and read temperature ranges.

The method 1200 may also include, at 1204, determining an adjusted value of a read voltage associated with reading data from the non-volatile memory. The adjusted value determined based on a default value of the read voltage and based on the read voltage offset value. For example, the trim adjuster 136 may use the read voltage offset value determined from the table 128 and a default value of the read voltage (e.g., the default value 301 of FIG. 3) to determine the adjusted value of the read voltage.

Figure 13:
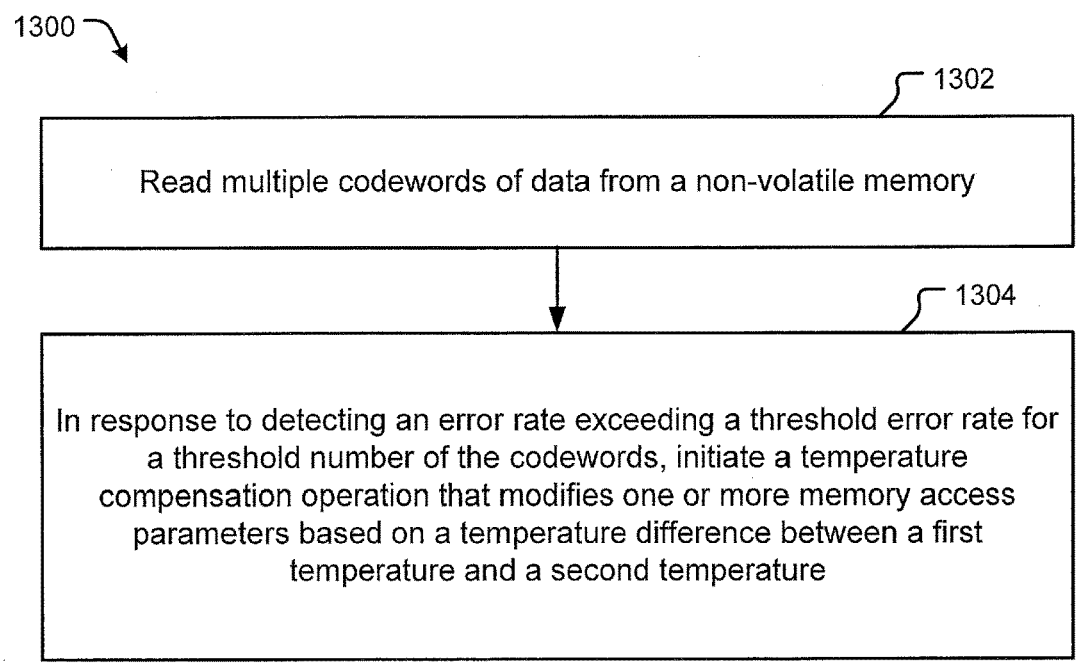
FIG. 13 is a flow diagram of another particular example of a method of temperature-based control that may be performed by the data storage device of FIG. 1.

FIG. 13 is a flow diagram of another particular example of a method 1300 of temperature-based control. The method 1300 may be performed at a data storage device that includes a controller and a non-volatile memory. For example, the method 1300 may be performed by the data storage device 102 of FIG. 1.

The method 1300 includes, at 1302, reading multiple codewords of data from the non-volatile memory. For example, as illustrated in FIG. 7, the controller 120 may read multiple codewords, such as the first codeword 702, the second codeword 704 and the third codeword 706 from the memory device 103.

The method 1300 also includes, at 1304, in response to detecting an error rate exceeding a threshold error rate for a threshold number of the codewords, initiating a temperature compensation operation that modifies one or more memory access parameters based on a temperature difference between a first temperature and a second temperature. For example, the error correction coding (ECC) engine 170 may generate the history of error rates data 708. In this example, the temperature-based adjuster 122 may compare the history of error rates data 708 to the error rate threshold 714 and to the number of codewords threshold 716. In a particular implementation, the threshold error rate is less than a threshold correctable error rate of the ECC engine 170. In response to detecting that an error rate exceeds a threshold error rate for a threshold number of the codewords, the temperature-based adjuster 122 initiates the temperature compensation operation 750. The temperature compensation operation 750 may cause one or more memory access parameters (such as the read voltage 164 of FIG. 1) to be modified based on a temperature difference between a first temperature associated with writing the multiple codewords to the non-volatile memory and a second temperature associated with reading the multiple codewords from the non-volatile memory.

Figure 14:
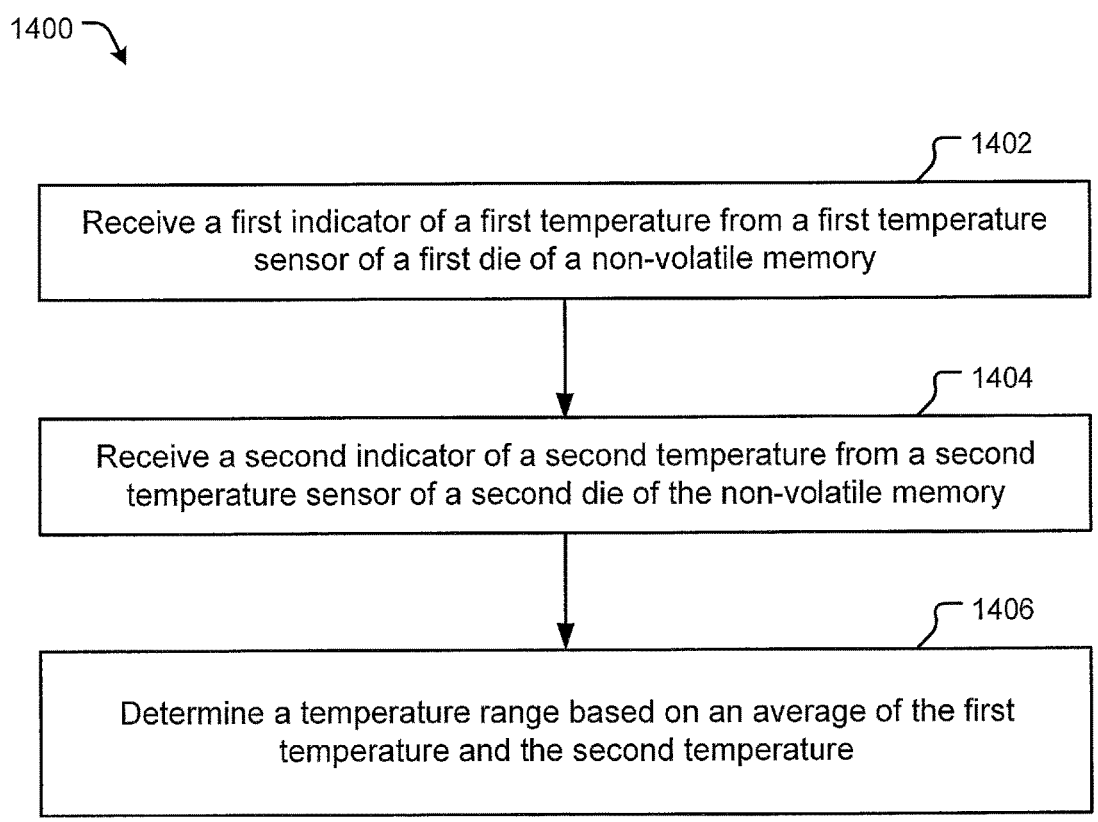
FIG. 14 is a flow diagram of another particular example of a method of determining a temperature range that may be performed by the data storage device of FIG. 1.

FIG. 14 is a flow diagram of another particular example of a method 1400 of determining a temperature range. The method 1400 may be performed at a data storage device that includes a controller and a non-volatile memory. For example, the method 1400 may be performed by the data storage device 102 of FIG. 1.

The method 1400 includes, at 1402, receiving a first indicator of a first temperature from a first temperature sensor of a first die of the non-volatile memory. For example, the memory device 103 may include a stack 820 of memory die as in FIG. 8. In this example, the first memory die 802 may include the first temperature sensor 812 which may generate and send the first indication 832, which indicates a temperature of the first memory die 802.

The method 1400 includes, at 1404, receiving a second indicator of a second temperature from a second temperature sensor of a second die of the non-volatile memory. For example, the second memory die may correspond to the i-th memory die 806 that includes the i-th temperature sensor 816. The i-th temperature sensor 816 may generate and send the i-th indication 836, which indicates a temperature of the i-th memory die 806. In this example, the stack 820 may also include other memory dies, one or more of which may include another temperature sensor. To illustrate, the stack 820 in FIG. 8 includes one or more memory dies stacked between the first memory die 802 and the i-th memory die 806, each of which may include a temperature sensor. The stack 820 includes one or more other dies, such the n-th memory die 808, which includes the nth temperature sensor 818. Thus, the first memory die 802 and the i-th memory die 804 may represent different portions of the stack 820. For example, in FIG. 8, the first memory die 802 is the top die of the stack 820 and the i-th memory die 804 is a central die (e.g., a memory die that is neither the top memory die nor the bottom memory die of the stack 820).

The method 1400 also includes, at 1406, determining a temperature range based on an average of the first temperature and the second temperature. For example, the controller 120 or the memory device 103 may determine the average temperature 840 based on the first indication 832 of the first temperature and based on the i-th indication 836 of the second temperature. In some implementations, the average temperature 840 may be further based on indications (such as the second indication 834, the nth indication 838, or both) of temperatures of other memory dies. The average temperature 840 may include or correspond to a mean temperature, a weighted mean temperature, a median temperature, a mode of the temperatures, or another statistical measure of central tendency. The average temperature may be associated with a memory access, such as indicating a temperature condition prior to, during, or upon completion of reading data from the memory 104 or writing data to the memory 104.

Figure 15:
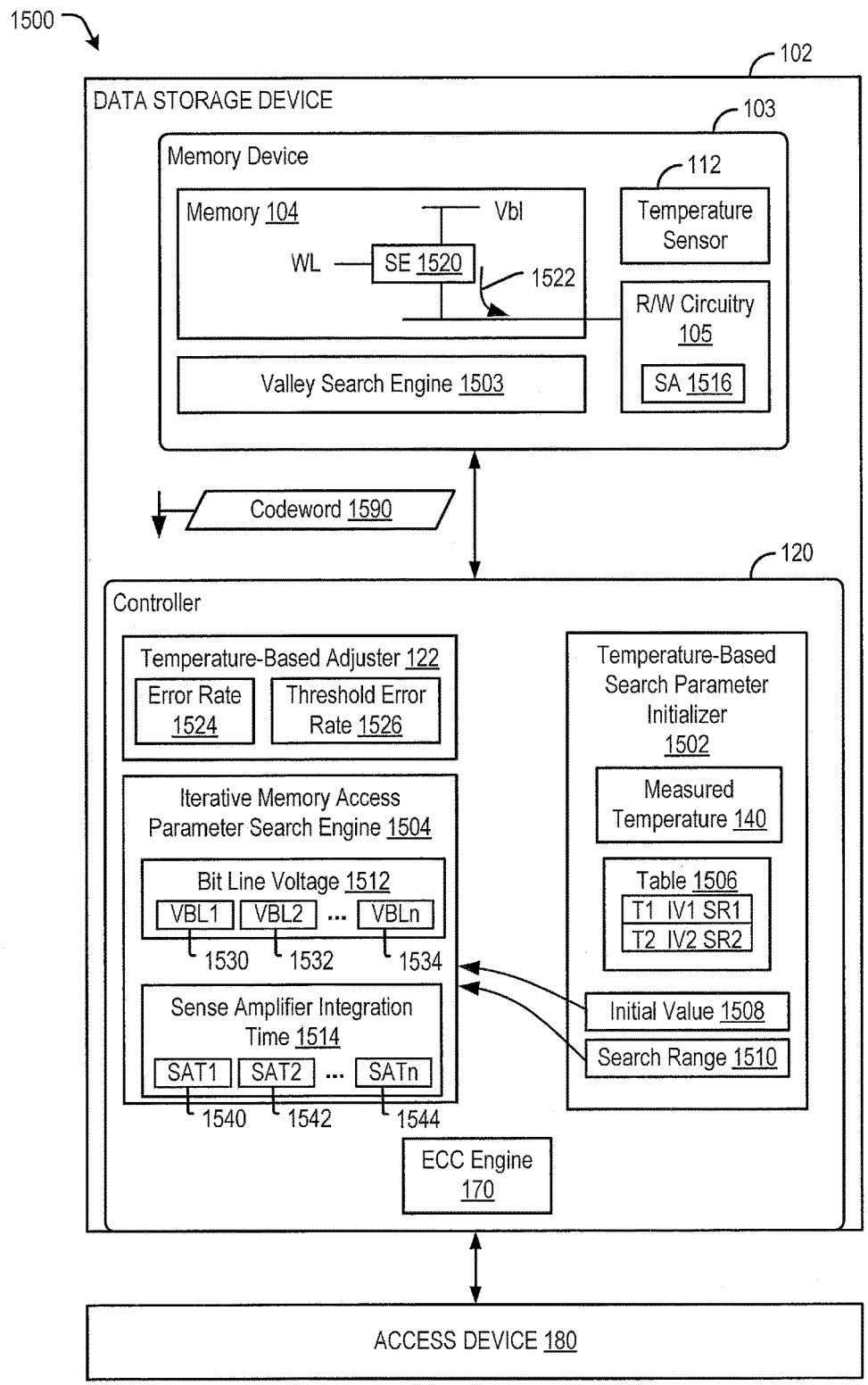
FIG. 15 is a block diagram of another illustrative example of a system including a data storage device configured to adjust memory access parameters based on temperature.

FIG. 15 depicts another illustrative example of a system 1500 that includes the data storage device 102 coupled to the access device (e.g., the access device 180). The data storage device 102 includes the memory device 103 and the controller 120. The controller 120 is configured to perform an iterative search of one or more memory access parameter values to find values of the one or more memory access parameters that reduce a number of errors in data read from the memory 104. One or more parameters used to perform the iterative search, such as an initial search value or a search range, is temperature-dependent and selected based on a temperature associated with the memory device 103.

The memory device 103 includes the memory 104, the read/write circuitry 105, and the temperature sensor 112. In the example of FIG. 15, the memory device 103 further includes a valley search engine 1503. The read/write circuitry 105 includes sense amplifiers, such as a representative sense amplifier 1516.

The memory 104 includes storage elements, such as a representative storage element 1520. The storage element 1520 (e.g., a flash memory cell) is coupled to a word line (WL) and to a bit line configured to receive a bit line voltage (Vb1). The read/write circuitry 105 is configured to bias the word line and the bit line to generate a sensing current 1522 at the bit line of the storage element 1520. The sensing current 1522 may charge a capacitor that is coupled to or included in the sense amplifier 1516. After a particular time period (e.g., a sense amplifier integration time), the sense amplifier 1516 may compare a voltage of the capacitor to a reference voltage to determine a state of the storage element 1520 (e.g., to determine whether the storage element 1520 is in an "on" state or an "off" state). The sensing current 1522 may be associated with a plot, such as a plot that indicates values of the sensing current 1522 as a function of values of a voltage difference between terminals (e.g., a source terminal and a control gate terminal) of the storage element 1520. In some circumstances, the plot may "shift" due to temperature-based effects at the data storage device 102, which may affect operation of the data storage device 102 (e.g., by increasing a number of errors in data read from the memory 104).

In the example of FIG. 15, the controller 120 includes the ECC engine 170 and also includes a temperature-based search parameter initializer 1502, the temperature-based adjuster 122, and an iterative memory access parameter search engine 1504. The temperature-based adjuster 122 is configured to initiate an iterative memory access parameter search that includes iteratively modifying one or more memory access parameters (e.g., to compensate for temperature-based effects in data read from the data storage device 102). The temperature-based search parameter initializer 1502 is configured to select one or more temperature-based values (e.g., one or more of an initial value or a search range) for the one or more memory access parameters based on a temperature measured at the data storage device 102. The iterative memory access parameter search engine 1504 is configured to iteratively adjust values of the one or more memory access parameters during the iterative memory access parameter search (e.g., to determine one or more "best" memory access parameters that reduce temperature-based effects on data read from the data storage device 102, such as by compensating for a "shift" in the plot associated with the sensing current 1522).

During operation, the data storage device 102 of FIG. 15 may perform one or more operations to access the memory 104. For example, the data storage device 102 may write data to the memory 104, such as by writing data after encoding the data using the ECC engine 170. As another example, the data storage device 102 may read data stored at the memory 104 to generate a codeword 1590 (e.g., a representation of a codeword of an ECC code that may include one or more bit errors). In some examples, one or more values (e.g., bits) of the codeword 1590 may be sensed from the storage element 1520. The codeword 1590 may include hard bits, soft bits, or both.

The controller 120 is configured to initiate an error correction process to correct one or more bit errors of the codeword 1590, such as by inputting the codeword 1590 to the ECC engine 170 to decode the codeword 1590. The controller 120 is configured to determine an error rate 1524 of the codeword 1590, such as by determining a bit error rate (BER) associated with the codeword 1590 or a cell error rate (CER) associated with storage elements storing the codeword 1590. The controller 120 is configured to determine whether the error rate 1524 exceeds a threshold error rate 1526. In a particular example, the threshold error rate 1526 is (e.g., corresponds to) a threshold correctable error rate of the ECC engine 170 (e.g., a "maximum" error rate that is within a particular error correction capability of a particular code used by the ECC engine 170 to encode data). To further illustrate, if the error rate 1524 exceeds the threshold error rate 1526, the controller 120 may detect a decoding failure, such as an uncorrectable ECC (UECC) event in some cases. A UECC event may result from a particular temperature of the data storage device 102 that increases a number of errors in data read from the memory 104. In a particular example, the ECC engine 170 is configured to estimate the error rate 1524 and to decode a re-read version of the codeword 1590 in response to an updated error rate of the re-read version being less than or equal to the threshold correctable error rate, as described further below.

The data storage device 102 is configured to generate a measured temperature, such as the measured temperature 140 (e.g., using the temperature sensor 112). The measured temperature 140 may be generated in connection with reading of the codeword 1590, such as in response to reading the codeword 1590 from the memory 104 or in response to determining that the error rate 1524 exceeds the threshold error rate 1526. In a particular illustrative example, the temperature sensor 112 is configured to generate the measured temperature 140 in response to a command from the controller 120.

The data storage device 102 may be configured to access a table 1506 based on the measured temperature 140. In a particular example, the table 1506 indicates a plurality of temperature values and one or more memory access parameters for each of the temperature values. To illustrate, for a particular temperature value or a temperature range (e.g., "T1" or "T2") corresponding to the measured temperature 140, the table 1506 may indicate one or more of an initial value 1508 (e.g., "IV1" or "IV2") of a memory access parameter or a search range 1510 (e.g., "SR1" or "SR2") for the memory access parameter. The data storage device 102 may be configured to use one or more of the initial value 1508 of the memory access parameter or the search range 1510 of the memory access parameter in connection with a "search" for a particular value of the memory access parameter that reduces temperature-based effects on data read from the memory 104 (e.g., by reducing a number of errors associated with the codeword 1590).

To further illustrate, the controller 120 is configured to determine a temperature-based value of a search parameter in response to detecting that the error rate 1524 of the codeword 1590 exceeds a threshold error rate 1526. The search parameter may correspond to one or more of a bit line voltage 1512 applied to one or more bit lines of the memory 104 (e.g., to the bit line coupled to the storage element 1520) or a sense amplifier integration time 1514. The temperature-based value may correspond to the initial value 1508 or the search range 1510. For example, the temperature-based search parameter initializer 1502 may be configured to access the table 1506 based on the measured temperature 140, such as by determining that the table 1506 indicates one or more temperature-based values (e.g., one or more of initial value 1508 or the search range 1510) of a search parameter (e.g., one or more of the bit line voltage 1512 or the sense amplifier integration time 1514) corresponding to the measured temperature 140.

The controller 120 is configured to iteratively modify one or more memory access parameters. For example, the temperature-based adjuster 122 is configured to initiate an iterative memory access parameter search that includes iteratively modifying the one or more memory access parameters. To illustrate, the one or more memory access parameters may include the bit line voltage 1512. In this case, the temperature-based adjuster 122 is configured to cause the iterative memory access parameter search engine 1504 to iteratively modify the bit line voltage 1512, such as by iteratively selecting the bit line voltage 1512 from a plurality of values that includes a first bit line voltage 1530 (VBL1), a second bit line voltage 1532 (VBL2), and an n-th bit line voltage 1534 (VBLn) (where "n" indicates a positive integer).

Alternatively or in addition to the bit line voltage 1512, the one or more memory access parameters may include a sense amplifier integration time 1514. In this example, the temperature-based adjuster 122 is configured to cause the iterative memory access parameter search engine 1504 to iteratively modify the sense amplifier integration time 1514, such as by iteratively selecting the sense amplifier integration time 1514 from a plurality of values that includes a first sense amplifier integration time 1540 (SAT1), a second sense amplifier integration time 1542 (SAT2), and an n-th sense amplifier integration time 1544 (SATn).

In some implementations, reducing one or more of the bit line voltage 1512 or the sense amplifier integration time 1514 reduces an amount of temperature-based variance in threshold voltages of storage elements of the memory 104. For example, storage elements of the memory 104 may have different temperature coefficients (TCOs), such as due to different physical locations of the storage elements. Reducing one or more of the bit line voltage 1512 or the sense amplifier integration time 1514 may reduce an amount of temperature-based variance in threshold voltages of the storage elements having different TCOs, which may reduce a number of errors in data read from the storage elements.

To further illustrate, in a first search mode, the temperature-based adjuster 122 is configured to cause the iterative memory access parameter search engine 1504 to iteratively adjust the value of the bit line voltage 1512 (e.g., without adjusting the value of the sense amplifier integration time 1514). In this example, the value of the sense amplifier integration time 1514 may remain "constant" during multiple iterations of the iterative memory access parameter search (and the value of the bit line voltage 1512 may be varied). In a second search mode, the temperature-based adjuster 122 is configured to cause the iterative memory access parameter search engine 1504 to iteratively adjust the value of the sense amplifier integration time 1514 (e.g., without adjusting the value of the bit line voltage 1512). In this example, the value of the bit line voltage 1512 may remain "constant" during multiple iterations of the iterative memory access parameter search (and the value of the sense amplifier integration time 1514 may be varied). In a third search mode, values of the bit line voltage 1512 and the sense amplifier integration time 1514 may be varied "in turns," such as by varying the value of the bit line voltage 1512 for a particular iteration (without varying the value of the sense amplifier integration time 1514 for the particular iteration) and by varying the value of the sense amplifier integration time 1514 for a subsequent iteration (without varying the value of the sense amplifier integration time for the subsequent iteration). In a fourth search mode, one or more combinations of values of the bit line voltage 1512 and the sense amplifier integration time 1514 may be used as "presets," such as presets indicated by the table 1506. In this example, the iterative memory access parameter search may be performed using one or more "preset" combinations of values of the bit line voltage 1512 and the sense amplifier integration time 1514.

In a particular illustrative example, the iterative memory access parameter search further includes a valley search that is performed by the valley search engine 1503 using one or more memory access parameters of the iterative memory access parameter search. For example, the valley search engine 1503 may be configured to apply multiple bias voltages to storage elements of the memory 104 during the valley search, such as by performing a CVD scan of one or more regions of the memory 104 for each of multiple values of the bit line voltage 1512 to generate information representing multiple histograms of cell voltage distributions (CVDs). The valley search engine 1503 may be configured to determine, for each of the multiple bias voltages, a number of storage elements of the memory 104 associated with that bias voltage and to select a particular bias voltage of the multiple threshold voltages that corresponds to a valley having a least number of storage elements. The bit line voltage resulting in the lowest valley (e.g., the least populated valley bin) may be selected. For example, a particular value of the bit line voltage 1512 may be selected based on the multiple histograms, such as by selecting a particular value of the bit line voltage 1512 corresponding to a histogram that has a lowest "valley" between cell voltage distributions. The memory 104 may be configured to perform the valley search (e.g., using the valley search engine 1503) and to send a result of the valley search to the controller 120. The controller 120 may be configured to initiate one or more subsequent read operations to the memory 104 based on the result (e.g., using the value of the bit line voltage 1512 determined during the valley search).

The controller 120 is configured to re-read the codeword 1590 using the modified one or more memory access parameters. For example, after modifying the one or more memory access parameters, another read operation may be performed at the memory 104 (e.g., during a subsequent iteration of the iterative memory access parameter search). The read operation may include re-generating the sensing current 1522. Iteratively modifying the one or more memory access parameters may change a value of the sensing current 1522 (and may affect a value sensed from the storage element 1520). The re-read codeword 1590 may include hard bits, soft bits, or both.

In another particular example, the iterative memory access parameter search engine 1504 is configured to perform the iterative memory access parameter search at least partially based on an error metric associated with re-reading the codeword 1590. The iterative memory access parameter search engine 1504 may iteratively adjust values of the bit line voltage 1512, the sense amplifier integration time 1514, or both, and may cause the controller 120 to re-read the codeword 1590 using the adjusted values. The re-read codeword 1590 may be processed by the ECC engine 170 to generate a value of the error metric, such as an estimated or actual error count or BER associated with the codeword 1590. Values of one or both of the bit line voltage 1512 or the sense amplifier integration time 1514 that result in a lowest number of errors may be selected as the modified one or more read access parameters.

After re-reading the codeword 1590 (e.g., transferring the sensed codeword from the memory device 103 to the controller 120), the controller 120 may update the error rate 1524 based on the re-read codeword 1590. In some implementations, the iterative memory access parameter search terminates in response to determining a particular error rate of the re-read codeword 1590 that is less than the threshold error rate 1526. In other implementations, the iterative memory access parameter search terminates in response to a threshold number of iterations of the iterative memory access parameter search (e.g., in response to "trying" a designated number of values of one or both of the bit line voltage 1512 or the sense amplifier integration time 1514). In another illustrative example, the iterative memory access parameter search terminates in response to determining that a threshold number of iterations of the iterative memory access parameter search have been performed. In another example, the iterative memory access parameter search terminates in response to determining that the error metric of the codeword 1590 (or the re-read codeword 1590) is less than a threshold. In another example, the iterative memory access parameter search terminates in response to determining that the error metric has not been reduced as compared to a prior iteration of the iterative memory access parameter search (e.g., that the error metric no longer "improves" due to adjustment of one or more memory access parameters). In another example, the iterative memory access parameter search terminates in response to determining that all values of the one or more memory access parameters (e.g., all values of the bit line voltage 1512, all values of the sense amplifier integration time 1514, or both) have been used in the iterative memory access parameter search. In another example, the iterative memory access parameter search terminates in response to detecting successful decoding of the re-read ECC codeword 1590.

In some examples, the data storage device 102 may determine a "direction" of the iterative memory access parameter search (e.g., to determine an amount by which a subsequent iteration increases or decreases a value of the bit line voltage 1512 or the sense amplifier integration time 1514) using a gradient descent technique (also referred to as a "steepest" descent technique, a gradient ascent technique, or a steepest ascent technique). For example, the iterative memory access parameter search engine 1504 may be configured to increase (or decrease) a value of the bit line voltage 1512 or the sense amplifier integration time 1514 based on a gradient of a set of error metrics associated with the codeword 1590, such as in proportion to the gradient or in proportion to a negative of the gradient. In some implementations, the gradient descent technique may indicate one or more termination criterion of the iterative memory access parameter search, such as if the iterative memory access parameter search is terminated in response to a particular amount of increase (or decrease) of a value of the bit line voltage 1512 or the sense amplifier integration time 1514.

In a particular example, the initial value 1508 may be determined based on values of the one or more memory access parameters previously selected by the iterative memory access parameter search. For example, one or more memory access parameters determined based on the measured temperature 140 may be "saved" as entries of the table 1506 and may be used as temperature-based values to initialize a subsequent iterative memory access parameter search.

One or more aspects of FIG. 15 may reduce time or complexity of a search to compensate for temperature-based effects at the memory 104. For example, by selecting one or more of the initial value 1508 or the search range 1510 based on the measured temperature 140, an iterative memory access parameter search may be initialized based on current operating conditions of the data storage device 102. As a result, initializing an iterative memory access parameter search based on the measured temperature 140 may reduce time spent performing the iterative memory access parameter search or may improve accuracy of the iterative memory access parameter search.

It should be appreciated that the aspects of FIG. 15 are illustrative and that other examples are within the scope of the disclosure. For example, although FIG. 15 depicts that the memory device 103 includes the valley search engine 1503, in another implementation, the valley search engine 1503 may be omitted from the data storage device 102. To illustrate, an iterative memory access parameter search may be performed without using a valley search (e.g., as described with reference to the illustrative example of FIG. 16).

As another example, although the iterative memory access parameter search engine 1504 is described with reference to an error search, in other examples, another search may be used. For example, alternatively or in addition to an error metric, the iterative memory access parameter search engine 1504 may be configured to use reliability information in connection with an iterative memory access parameter search. Reliability information may include one or more of an estimated number of errors of the codeword 1590, a syndrome weight of the codeword 1590, or an indication of a number of storage elements of that memory 104 having states near a state boundary (e.g., within a "valley" between state distributions), as illustrative examples.

As an additional example, although the bit line voltage 1512 and the sense amplifier integration time 1514 are described for illustration, an iterative memory access parameter search may be performed using only one of the bit line voltage 1512 or the sense amplifier integration time 1514. Alternatively or in addition, an iterative memory access parameter search may be performed using one or more other memory access parameters, such as by iteratively adjusting a read voltage of "neighbor" cells that are adjacent to (or near) storage elements of the memory 104 storing values of the codeword 1590 or by iteratively adjusting a source voltage of storage elements of the memory 104 storing values of the codeword 1590, as illustrative examples.

As another example, although certain examples have been described with reference to a read temperature (e.g., the measured temperature 140), a programming temperature may also be used in connection with an iterative memory access parameter search. For example, a cross temperature may indicate a different between a first temperature detected upon writing the codeword 1590 to the memory 104 and a second temperature determined upon reading the codeword 1590 from the memory 104 (e.g., the measured temperature 140). In some implementations, an iterative memory access parameter search is initialized based on the cross temperature. For example, the table 1506 may be indexed by cross temperatures (e.g., instead of by measured temperatures), and the temperature-based search parameter initializer 1502 may be configured to select values of one or more of the initial value 1508 or the search range 1510 based on a particular cross temperature. In this example, the controller 120 may be configured to select one or more of the initial value 1508 or the search range 1510 based on a difference between the measured temperature 140 and a programming temperature. To illustrate, the programming temperature may be associated with a temperature tag corresponding to a particular storage region of the memory 104 (e.g., a word line, a plurality of word lines, a block, a plurality of blocks, or another storage region of the memory 104). The temperature tag may indicate one or more measured temperatures associated with the particular storage region detected upon programming data to the storage region. In another example, the controller 120 may be configured to select one or more of the initial value 1508 or the search range 1510 based on the measured temperature 140 (e.g., without reference to a programming temperature).

It is also noted that an iterative memory access parameter search may be performed on a "global" basis (e.g., for each storage region of the memory device 103) or separately for each of multiple regions of the memory device 103. For example, an iterative memory access parameter search may be performed on a per die basis (e.g., separately for each memory die of the memory device 103), on a per block basis (e.g., for each block of the memory 104, such as for each erase group of storage elements), or on another basis.

Figure 16:
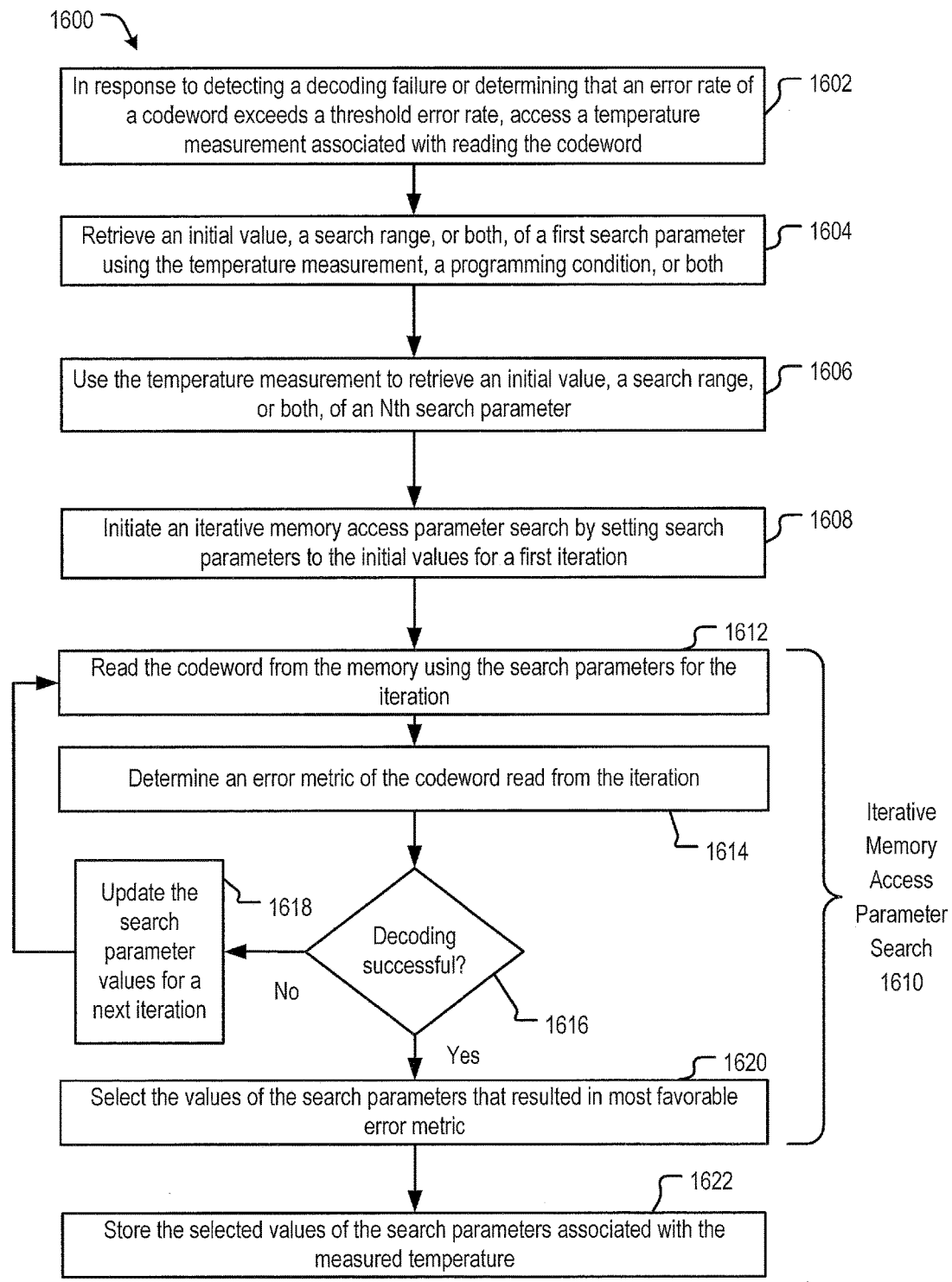
FIG. 16 is a flow diagram of a particular example of a method of temperature-based control that may be performed by the data storage device of FIG. 15.

Referring to FIG. 16, a particular illustrative example of a method is depicted and generally designated 1600. The method 1600 may be performed at a data storage device, such as at the data storage device 102 of FIG. 15.

The method 1600 includes accessing, in response to detecting a decoding failure or determining that an error rate of a codeword exceeds a threshold error rate, a temperature measurement associated with reading the codeword, at 1602. For example, the data storage device 102 of FIG. 15 may access the measured temperature 140 in response to detecting a decoding failure associated with decoding the codeword 1590. As another example, the data storage device 102 of FIG. 15 may access the measured temperature 140 in response to determining that the error rate 1524 of the codeword 1590 exceeds the threshold error rate 1526.

The method 1600 further includes retrieving an initial value, a search range, or both, of a first search parameter using the temperature measurement, a programming condition, or both, at 1604. For example, the temperature-based search parameter initializer 1502 may use a value of the measured temperature 140 or a difference between the measured temperature 140 and a programming temperature associated with the codeword 1590 as a lookup to the table 1506 to determine the initial value 1508 of the bit line voltage 1512. Alternatively, or in addition, the measured temperature 140 or a difference between the measured temperature 140 and a programming temperature associated with the codeword 1590 may be used to determine the search range 1510 of the bit line voltage 1512.

The method 1600 further includes using the temperature measurement to retrieve an initial value, a search range, or both, of an Nth search parameter, at 1606. For example, the temperature-based search parameter initializer 1502 may use a value of the measured temperature 140 as a lookup to the table 1506 to determine the initial value 1508 of the sense amplifier integration time 1514. Alternatively, or in addition, the measured temperature 140 may be used to determine the search range 1510 of the sense amplifier integration time 1514.

The method 1600 further includes initiating an iterative memory access parameter search 1610 by setting search parameters to the initial values for a first iteration, at 1608. For example, the controller 120 may initialize the iterative memory access parameter search 1610 by sending one or more commands to the iterative memory access parameter search engine 1504 to perform one or more operations of the iterative memory access parameter search 1610.

The method 1600 further includes performing the iterative memory access parameter search 1610. In the example of FIG. 16, performing the iterative memory access parameter search 1610 includes reading the codeword from the memory using the search parameters for the iteration, at 1612. For example, the codeword 1590 may be re-read from the memory 104 during a particular iteration of the iterative memory access parameter search 1610.

The iterative memory access parameter search 1610 may include determining an error metric of the codeword read from the iteration, at 1614. For example, after re-reading the codeword 1590, an updated error rate may be determined based on the re-read codeword 1590.

The iterative memory access parameter search 1610 further includes determining whether decoding is successful, at 1616. For example, the ECC engine 170 may determine whether decoding of the re-read codeword 1590 is successful.

In response to determining that decoding is unsuccessful, at 1616, the iterative memory access parameter access search 1610 further includes updating the search parameter values for a next iteration, at 1618. For example, a value of one or more of the bit line voltage 1512 or the sense amplifier integration time 1514 may be adjusted prior to the next iteration of the iterative memory access parameter search 1610.

Alternatively, in response to determining that decoding is successful, at 1616, the iterative memory access parameter search 1610 may terminate. For example, the iterative memory access parameter search 1610 may terminate in response to successfully decoding the re-read codeword 1590 after re-reading the codeword 1590 using one or more search parameters determined during the iterative memory access parameter search 1610, at 1612. In some examples, the iterative memory access parameter search 1610 further includes selecting the values of the search parameters that resulted in a most favorable error metric, at 1620. As a particular example, particular values of one or more of the bit line voltage 1512 or the sense amplifier integration time 1514 that result in a lowest error rate associated with the codeword 1590 may be selected.

The method 1600 may further include storing the selected values of the search parameters associated with the measured temperature, at 1622. For example, the selected values of the search parameters may be stored at the memory 104 or at the controller 120, such as in a time tag or in the table 1506.

The method 1600 may reduce time or complexity of a search to compensate for temperature-based effects at the memory 104. For example, the iterative memory access parameter search 1610 may be initialized based on current operating conditions of the data storage device 102, such as the measured temperature 140. As a result, initializing an iterative memory access parameter search based on the measured temperature 140 may reduce time spent performing the iterative memory access parameter search or may improve accuracy of the iterative memory access parameter search.

Figure 17:
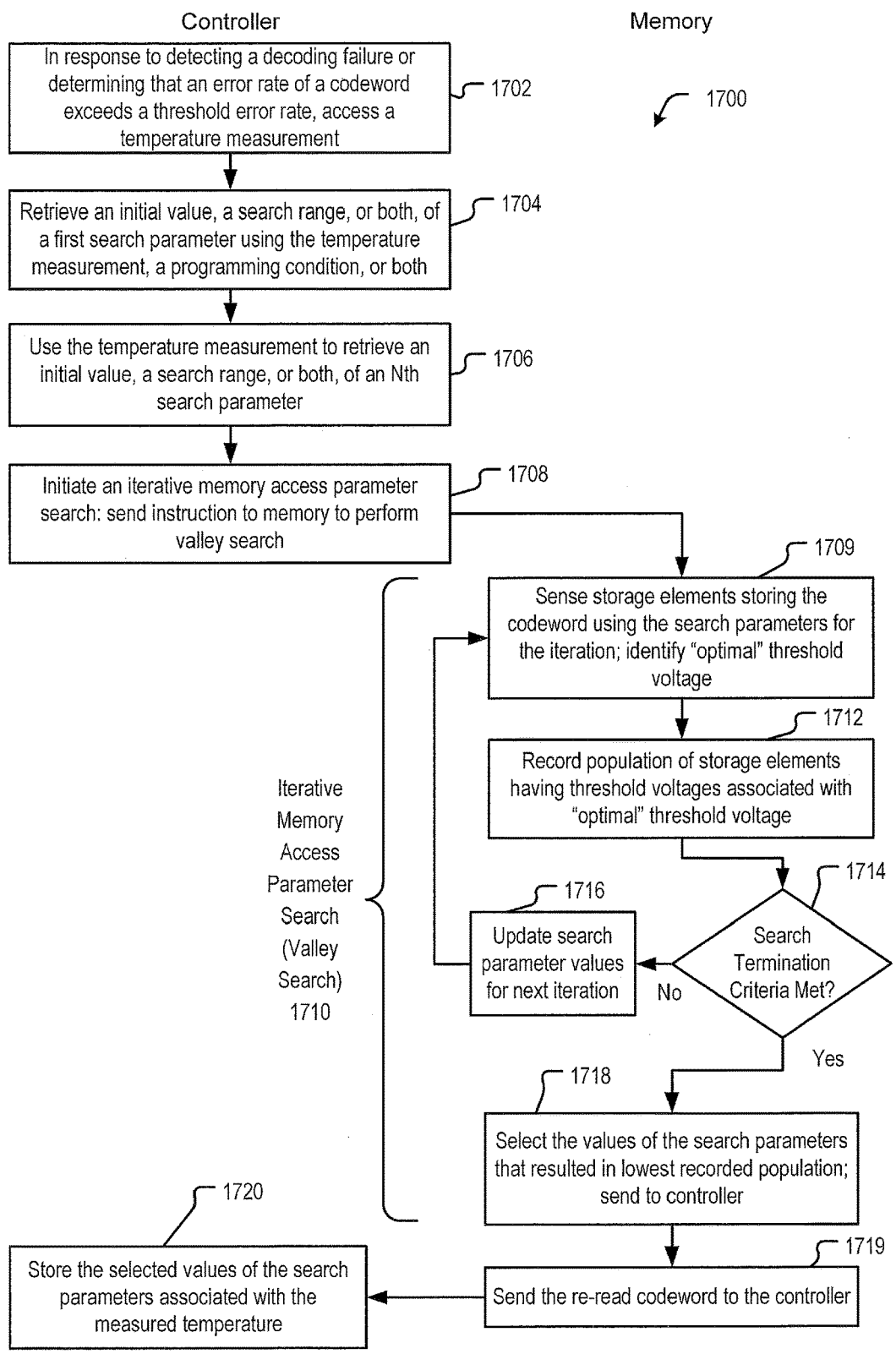
FIG. 17 is a flow diagram of another particular example of a method of temperature-based control that may be performed by the data storage device of FIG. 15.

Referring to FIG. 17, a particular illustrative example of a method is depicted and generally designated 1700. The method 1700 may be performed at a data storage device, such as at the data storage device 102 of FIG. 15. In FIG. 17, operations illustrated on the left-hand side may be performed by the controller 120 of FIG. 15, and operations illustrated on the right-hand side of FIG. 17 may be performed by the memory 104 of FIG. 15. The method 1700 may include operations of a valley search (e.g., a valley search performed by the valley search engine 1503), such as the valley search described with reference to FIG. 15.

The method 1700 includes accessing, in response to detecting a decoding failure or determining that an error rate of a codeword exceeds a threshold error rate, a temperature measurement associated with reading the codeword, at 1702. For example, the data storage device 102 of FIG. 15 may access the measured temperature 140 in response to detecting a decoding failure associated with decoding the codeword 1590. As another example, the data storage device 102 may access the measured temperature 140 in response to determining that the error rate 1524 of the codeword 1590 exceeds the threshold error rate 1526.

The method 1700 further includes using the temperature measurement to retrieve an initial value, a search range, or both, of a first search parameter, at 1704. For example, the temperature-based search parameter initializer 1502 may use a value of the measured temperature 140 as a lookup to the table 1506 to determine the initial value 1508 of the bit line voltage 1512. Alternatively, or in addition, the measured temperature 140 may be used to determine the search range 1510 of the bit line voltage 1512.

The method 1700 further includes using the temperature measurement to retrieve an initial value, a search range, or both, of an Nth search parameter, at 1706. For example, the temperature-based search parameter initializer 1502 may use a value of the measured temperature 140 as a lookup to the table 1506 to determine the initial value 1508 of the sense amplifier integration time 1514. Alternatively, or in addition, the measured temperature 140 may be used to determine the search range 1510 of the sense amplifier integration time 1514.

The method 1700 further includes initiating an iterative memory access parameter search 1710, such as by sending an instruction to a memory to perform a valley search, at 1708. For example, the iterative memory access parameter search engine 1504 of FIG. 15 may send a command to the memory 104 to perform a valley search using the first search parameter.

The method 1700 further includes sensing storage elements storing the codeword using the search parameters for the iteration, at 1709. For example, storage elements of the memory 104 storing the codeword 1590 may be sensed using the search parameters for the iteration. The valley search may be performed identify an "optimal" threshold voltage (e.g., a threshold voltage that results in a lowest "valley" between cell voltage distributions of a histogram).

The method 1700 further includes recording a population of storage elements having threshold voltages associated with a "optimal" threshold voltage, at 1712. For example, the memory device 103 may store an indication of how many storage elements of the memory 104 have threshold voltages associated with (e.g., within a same histogram bin as) an "optimal" threshold voltage determined using the valley search.

The method 1700 further includes determining whether one or more search termination criteria are met, at 1714. In a particular illustrative example, determining whether the one or more search termination criteria are met includes determining whether a threshold number of iterations of the iterative memory access parameter search 1710 have been performed. In another example, determining whether the one or more search termination criteria are met includes determining whether the error metric of the codeword is less than a threshold. In another example, determining whether the one or more search termination criteria are met includes determining that the error metric has not been reduced as compared to a prior iteration of the iterative memory access parameter search 1710 (e.g., that the error metric no longer "improves" due to adjustment of one or more memory access parameters). In another example, determining whether the one or more search termination criteria are met includes determining that all values of the one or more memory access parameters (e.g., all values of the bit line voltage 1512, all values of the sense amplifier integration time 1514, or both) have been used in the iterative memory access parameter search 1710. In another example, determining whether the one or more search termination criteria are met includes detecting successful decoding of the re-read ECC codeword 1590 (e.g., by the ECC engine 170).

In response to determining that the one or more search termination criteria are unmet, at 1714, the iterative memory access parameter access search 1710 further includes updating the search parameter values for a next iteration, at 1716. For example, a value of one or more of the bit line voltage 1512 or the sense amplifier integration time 1514 may be adjusted prior to the next iteration of the iterative memory access parameter search 1710.

Alternatively, in response to determining that the one or more search termination criteria are met, at 1714, the iterative memory access parameter search 1710 further includes selecting the values of the search parameters that resulted in a lowest recorded population and sending the values to the controller, at 1718. For example, the memory device 103 may provide a value of the bit line voltage 1512 resulting in a lowest "valley" to the controller 120.

The method 1700 may further include sending the re-read ECC codeword corresponding to the selected values of the search parameters to the controller, at 1719. For example, the memory device 103 may send information to the controller 120 including the selected values of the search parameters, a re-read codeword 1590, other information, or a combination thereof. The method 1700 may also include receiving, by the controller 120, information from the memory device 103, the information including the selected values of the search parameters, the re-read ECC codeword 1590, other information, or a combination thereof.

The method 1700 may further include storing the selected values of the search parameters associated with the measured temperature, at 1720. For example, the selected values may be stored at the memory 104 or at the controller 120, such as in a time tag or in the table 1506, as illustrative examples.

The method 1700 of FIG. 17 illustrates that an iterative memory access parameter search may be performed in connection with a valley search. For example, one or more operations of the iterative memory access parameter search 1710 may be performed in connection with a valley search. Because the valley search may be performed using hardware of the memory device 103 rather than by exchanging instructions and read data between the memory device 103 and the controller 120 for each iteration of a search, the valley search may generate results more quickly than the method 1600 of FIG. 16 in some applications.

Although certain operations described with reference to FIG. 17 are described as being performed by the memory device 103 of FIG. 15, in other implementations, such operations may be performed by the controller 120 of FIG. 15 (or vice versa). For example, the iterative memory access parameter search 1710 may be performed by the controller 120, such as by a valley search engine corresponding to the valley search engine 1503 that may be included in the controller 120.

Figure 18:
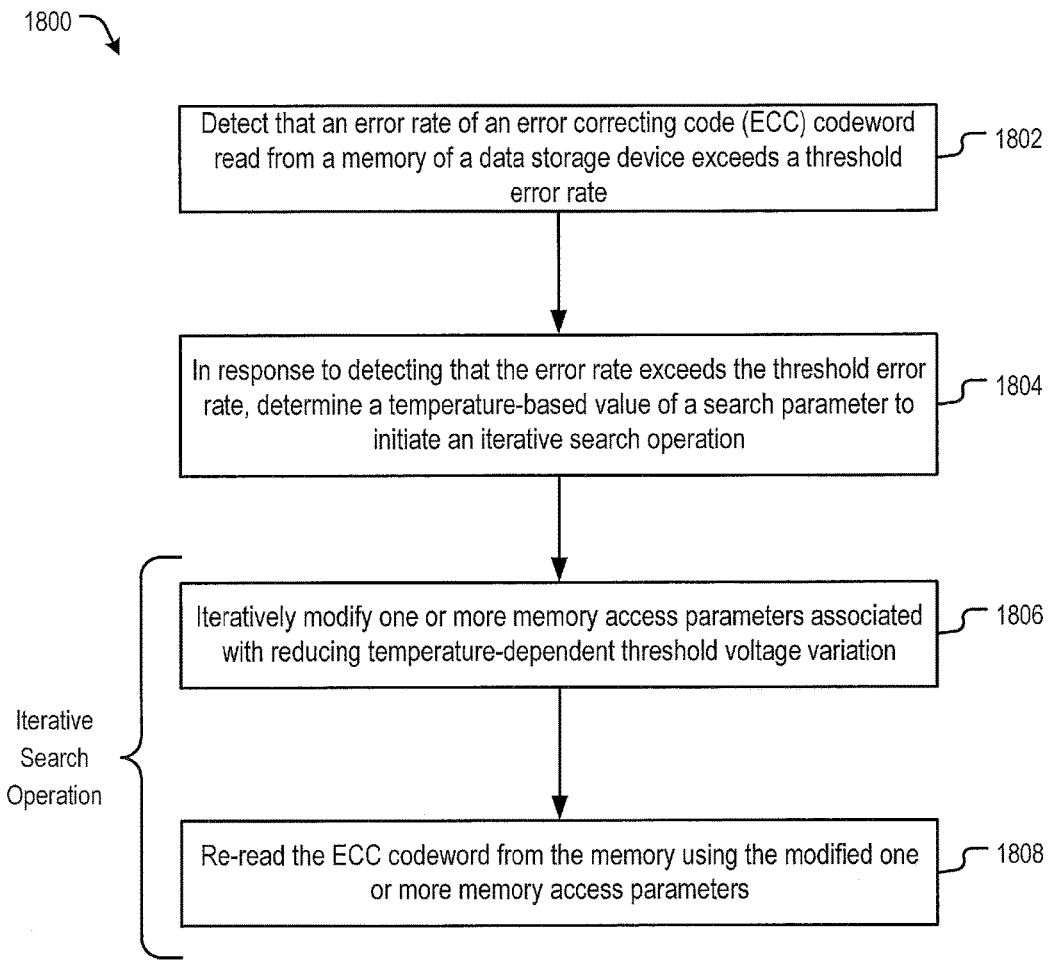
FIG. 18 is a flow diagram of another particular example of a method of temperature-based control that may be performed by the data storage device of FIG. 15.

FIG. 18 is a flow diagram of a particular example of a method 1800 of operation of a data storage device that includes a memory. In a particular example, the method 1800 may be performed by the data storage device 102 of FIG. 15.

The method 1800 includes detecting that an error rate of an ECC codeword read from the memory of the data storage device exceeds a threshold error rate, at 1802. For example, the data storage device 102 is configured to read the codeword 1590 from the memory 104. The temperature-based search parameter initializer 1502 is configured to detect that the error rate 1524 of the codeword 1590 exceeds the threshold error rate 1526.

The method 1800 further includes determining, in response to detecting that the error rate exceeds the threshold error rate, a temperature-based value of a search parameter to initiate an iterative search operation, at 1804. The iterative search operation includes iteratively modifying one or more memory access parameters associated with reducing temperature-dependent threshold voltage variation, at 1806. The iterative search operation further includes re-reading the ECC codeword from the memory using the modified one or more memory access parameters, at 1808. The modified one or more memory access parameters may include one or more of a bit line voltage (e.g., the bit line voltage 1512) or a sense amplifier integration time (e.g., the sense amplifier integration time 1514), as illustrative examples. To illustrate, the iterative search operation may include the iterative memory access parameter search 1610 of FIG. 16 or the iterative memory access parameter search 1710 of FIG. 17.

In conjunction with the described embodiments, an apparatus includes means (e.g., the memory 104) for storing data (e.g., the codeword 1590). The apparatus further includes means (e.g., the controller 120) for determining a temperature-based value of a search parameter in response to detecting that an error rate (e.g., the error rate 1524) of the dataexceeds a threshold error rate (e.g., the threshold error rate 1526), for iteratively modifying one or more memory access parameters associated with reducing temperature-dependent threshold voltage variation, and for re-reading the data using the modified one or more memory access parameters. The apparatus may further include means (e.g., the ECC engine 170) for error correction, where the threshold error rate corresponds to a threshold correctable error rate (e.g., the threshold error rate 1526) of the means for error correction.

Although the controller 120 and certain other components described herein are illustrated as block components and described in general terms, such components may include one or more microprocessors, state machines, and/or other circuits configured to enable the data storage device 102 (or one or more components thereof) to perform operations described herein. Components described herein may be operationally coupled to one another using one or more nodes, one or more buses (e.g., data buses and/or control buses), one or more other structures, or a combination thereof. One or more components described herein may include one or more physical components, such as hardware controllers, state machines, logic circuits, one or more other structures, or a combination thereof, to enable the data storage device 102 to perform one or more operations described herein. For example, one or more of the temperature-based adjuster 122, the temperature-based search parameter initializer 1502, or the iterative memory access parameter search engine 1504 may include one or more physical components, such as hardware controllers, state machines, logic circuits, one or more other structures, or a combination thereof, to enable the data storage device 102 to initiate, perform, and terminate an iterative memory access parameter search.

Alternatively or in addition, one or more aspects of the data storage device 102 may be implemented using a microprocessor or microcontroller programmed (e.g., by executing instructions) to perform one or more operations described herein, such as one or more operations of the methods 900-1400 and 1600-1800. For example, one or more operations described with reference to the temperature-based adjuster 122, the temperature-based search parameter initializer 1502, and the iterative memory access parameter search engine 1504 may be performed using a processor (e.g., a microprocessor or a microcontroller) that executes instructions to initiate, perform, or terminate an iterative memory access parameter search.

In a particular embodiment, the data storage device 102 includes a processor executing instructions (e.g., firmware) retrieved from the memory device 103. Alternatively or in addition, instructions that are executed by the processor may be retrieved from memory separate from the memory device 103, such as at a read-only memory (ROM) that is external to the memory device 103.

It should be appreciated that one or more operations described herein as being performed by the controller 120 may be performed at the memory device 103. As an illustrative example, one or more operations of a valley search (e.g., the valley search described with reference to FIG. 17) may be performed by the controller 120 of FIG. 13. As another example, in-memory ECC operations (e.g., encoding operations and/or decoding operations) may be performed at the memory device 103 alternatively or in addition to performing such operations at the controller 120.

To further illustrate, the data storage device 102 may be configured to be coupled to the access device 180 as embedded memory, such as in connection with an embedded MultiMedia Card (eMMC®) (trademark of JEDEC Solid State Technology Association, Arlington, Va.) configuration, as an illustrative example. The data storage device 102 may correspond to an eMMC device. As another example, the data storage device 102 may correspond to a memory card, such as a Secure Digital (SD®) card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). The data storage device 102 may operate in compliance with a JEDEC industry specification. For example, the data storage device 102 may operate in compliance with a JEDEC eMMC specification, a JEDEC Universal Flash Storage (UFS) specification, one or more other specifications, or a combination thereof.

The memory device 103 may include a three-dimensional (3D) memory, such as a resistive random access memory (ReRAM), a flash memory (e.g., a NAND memory, a NOR memory, a single-level cell (SLC) flash memory, a multi-level cell (MLC) flash memory, a divided bit-line NOR (DINOR) memory, an AND memory, a high capacitive coupling ratio (HiCR) device, an asymmetrical contactless transistor (ACT) device, or another flash memory), an erasable programmable read-only memory (EPROM), an electrically-erasable programmable read-only memory (EEPROM), a read-only memory (ROM), a one-time programmable memory (OTP), or a combination thereof. Alternatively or in addition, the memory device 103 may include another type of memory. In a particular embodiment, the data storage device 102 is indirectly coupled to an access device (e.g., the access device 180) via a network. For example, the data storage device 102 may be a network-attached storage (NAS) device or a component (e.g., a solid-state drive (SSD) component) of a data center storage system, an enterprise storage system, or a storage area network. The memory device 103 may include a semiconductor memory device.

Semiconductor memory devices include volatile memory devices, such as dynamic random access memory ("DRAM") or static random access memory ("SRAM") devices, non-volatile memory devices, such as resistive random access memory ("ReRAM"), magnetoresistive random access memory ("MRAM"), electrically erasable programmable read only memory ("EEPROM"), flash memory (which can also be considered a subset of EEPROM), ferroelectric random access memory ("FRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure. In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate). As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Alternatively, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this disclosure is not limited to the two dimensional and three dimensional exemplary structures described but cover all relevant memory structures within the spirit and scope of the disclosure as described herein and as understood by one of skill in the art. The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments. Those of skill in the art will recognize that such modifications are within the scope of the present disclosure.

The above-disclosed subject matter is to be considered illustrative, and not restrictive, and the appended claims are intended to cover all such modifications, enhancements, and other embodiments, that fall within the scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A device comprising:
a memory; and
a controller coupled to the memory, the controller configured to:
    detect that an error rate of an error correcting code (ECC) codeword read from a memory of a data storage device exceeds a threshold error rate;
    determine a temperature-based value of a search parameter by a lookup of a table in response to detecting that the error rate of the codeword read from the memory exceeds the threshold error rate;
    iteratively modify one or more memory access parameters associated with reducing temperature-dependent threshold voltage variation; and
    re-read the codeword using the modified one or more memory access parameters.

2. The device of claim 1, further comprising an error correction coding (ECC) engine, and wherein the threshold error rate is a threshold correctable error rate of the ECC engine.

3. The device of claim 1, wherein the modified one or more memory access parameters include one or more of a bit line voltage or a sense amplifier integration time.

4. The device of claim 1, wherein the memory is configured to:
perform a valley search; and
send a result of the valley search to the controller.

5. The device of claim 1, wherein the temperature-based value of the search parameter comprises one or more of an initial value or a search range of the one or more memory access parameters that is determined based on a temperature associated with the memory.

6. A device comprising:
a memory;
a controller coupled to the memory, the controller configured to:
    determine a temperature-based value of a search parameter in response to detecting that an error rate of a codeword read from the memory exceeds a threshold error rate;
    iteratively modify one or more memory access parameters associated with reducing temperature-dependent threshold voltage variation; and
    re-read the codeword using the modified one or more memory access parameters; and
an error correction coding (ECC) engine, wherein the threshold error rate is a threshold correctable error rate of the ECC engine, and wherein the ECC engine is configured to estimate the error rate and to decode the re-read codeword in response to an updated error rate of the re-read codeword being less than or equal to the threshold correctable error rate.

7. A device comprising:
a memory, wherein the memory is configured to:
    perform a valley search; and
    send a result of the valley search to a controller;
the controller coupled to the memory, the controller configured to:
    determine a temperature-based value of a search parameter in response to detecting that an error rate of a codeword read from the memory exceeds a threshold error rate;

iteratively modify one or more memory access parameters associated with reducing temperature-dependent threshold voltage variation; and
re-read the codeword using the modified one or more memory access parameters; and
a valley search engine configured to:
apply multiple bias voltages to storage elements of the memory during the valley search;
determine, for each of the multiple bias voltages, a number of storage elements associated with the bias voltage; and
select a particular bias voltage of the multiple bias voltages that corresponds to a least number of the storage elements.

8. A device comprising:
a memory; and
a controller coupled to the memory, the controller configured to:
determine a temperature-based value of a search parameter in response to detecting that an error rate of a codeword read from the memory exceeds a threshold error rate;
iteratively modify one or more memory access parameters associated with reducing temperature-dependent threshold voltage variation; and
re-read the codeword using the modified one or more memory access parameters, wherein the controller is further configured to perform an iterative memory access parameter search to determine values of the one or more memory access parameters at least partially based on an error metric associated with re-reading the codeword.

9. A device comprising:
a memory; and
a controller coupled to the memory, the controller configured to:
determine a temperature-based value of a search parameter in response to detecting that an error rate of a codeword read from the memory exceeds a threshold error rate;
iteratively modify one or more memory access parameters associated with reducing temperature-dependent threshold voltage variation; and
re-read the codeword using the modified one or more memory access parameters, wherein:
the temperature-based value of the search parameter comprises an initial value and a search range of the one or more memory access parameters;
the controller is further configured to select the initial value and the search range based on a measured temperature or based on a difference between the measured temperature and a programming temperature associated with the codeword; and
the programming temperature is associated with a temperature tag corresponding to a particular storage region of the memory.

10. An apparatus comprising:
means for storing data;
means for detecting that an error rate of an error correcting code (ECC) codeword read from a memory of a data storage device exceeds a threshold error rate; and
means for determining a temperature-based value of a search parameter by the lookup of a table in response to detecting that an error rate of the data exceeds the threshold error rate, for iteratively modifying one or more memory access parameters associated with reducing temperature-dependent threshold voltage variation and for re-reading the data using the modified one or more memory access parameters; and
a means for adjusting a temperature for the apparatus.

11. The apparatus of claim 10, further comprising means for error correction, and wherein the threshold error rate corresponds to a threshold correctable error rate of the means for error correction.

12. The apparatus of claim 10, wherein the modified one or more memory access parameters includes a bit line voltage.

13. The apparatus of claim 10, wherein the modified one or more memory access parameters includes a sense amplifier integration time.

14. The apparatus of claim 10, wherein the temperature-based value of the search parameter comprises an initial value of the one or more memory access parameters, the temperature-based value determined based on a temperature associated with the means for storing data.

15. The apparatus of claim 10, wherein the temperature-based value of the search parameter comprises a search range of the one or more memory access parameters, the temperature-based value determined based on a temperature associated with the means for storing data.

16. A method of operation of a data storage device that includes a memory, the method comprising:
detecting that an error rate of an error correcting code (ECC) codeword read from a memory of a data storage device exceeds a threshold error rate, wherein multiple ECC codewords can be read; and
in response to detecting that the error rate exceeds the threshold error rate, determining a temperature-based value of a search parameter by a lookup of a table to initiate an iterative search operation, the iterative search operation including:
iteratively modifying one or more memory access parameters associated with reducing temperature-dependent threshold voltage variation; and
re-reading the ECC codeword from the memory using the modified one or more memory access parameters.

17. The method of claim 16, wherein the modified one or more memory access parameters includes one or more of a bit line voltage or a sense amplifier integration time.

18. The method of claim 16, wherein the temperature-based value of the search parameter comprises an initial value or a search range of the one or more memory access parameters, the temperature-based value determined based on a temperature associated with the memory.

19. The method of claim 16, further comprising receiving information from the memory, the information including selected values of search parameters, the re-read ECC codeword, other information, or a combination thereof.

20. A method of operation of a data storage device that includes a memory, the method comprising:
detecting that an error rate of an error correcting code (ECC) codeword read from a memory of a data storage device exceeds a threshold error rate; and
in response to detecting that the error rate exceeds the threshold error rate, determining a temperature-based value of a search parameter to initiate an iterative search operation, the iterative search operation including:
iteratively modifying one or more memory access parameters associated with reducing temperature-dependent threshold voltage variation;

re-reading the ECC codeword from the memory using the modified one or more memory access parameter; and terminating the iterative search operation in response to detecting successful decoding of the re-read ECC codeword.

* * * * *